United States Patent
Kim et al.

(10) Patent No.: US 8,185,853 B2
(45) Date of Patent: May 22, 2012

(54) TRANSFORMING VARIABLE DOMAINS FOR LINEAR CIRCUIT ANALYSIS

(75) Inventors: Jaeha Kim, Seoul (KR); Kevin D. Jones, Hayward, CA (US); Mark Horowitz, Menlo Park, CA (US)

(73) Assignee: Rambus Inc., Sunnyvale, CA (US)

( * ) Notice: Subject to any disclaimer, the term of this patent is extended or adjusted under 35 U.S.C. 154(b) by 160 days.

(21) Appl. No.: 12/594,873

(22) PCT Filed: Feb. 28, 2008

(86) PCT No.: PCT/US2008/055271
§ 371 (c)(1),
(2), (4) Date: Apr. 1, 2010

(87) PCT Pub. No.: WO2008/127793
PCT Pub. Date: Oct. 23, 2008

(65) Prior Publication Data
US 2010/0199237 A1    Aug. 5, 2010

Related U.S. Application Data

(60) Provisional application No. 60/923,139, filed on Apr. 11, 2007.

(51) Int. Cl.
*G06F 17/50* (2006.01)
(52) U.S. Cl. ........ 716/107; 716/103; 716/111; 716/136; 703/16
(58) Field of Classification Search .................. 716/107, 716/103, 111, 136; 703/16
See application file for complete search history.

(56) References Cited

U.S. PATENT DOCUMENTS

| | | | |
|---|---|---|---|
| 5,394,346 A * | 2/1995 | Milsom | 703/14 |
| 7,346,867 B2 * | 3/2008 | Su et al. | 716/115 |
| 7,380,224 B2 * | 5/2008 | Franco et al. | 716/103 |
| 7,421,379 B2 * | 9/2008 | Levy | 703/2 |
| 7,680,642 B2 * | 3/2010 | Hashimoto et al. | 703/14 |
| 2006/0095243 A1 * | 5/2006 | Levy | 703/14 |
| 2006/0155522 A1 * | 7/2006 | Hashimoto et al. | 703/15 |

OTHER PUBLICATIONS

Lagarde et al., "A New Non-Linear Electrothermal 3D Spline Model with Charge Integration for Power FETs", 2005 European Microwave Conference, vol. 2, Oct. 4-6, 2005, pp. 1-4.*
Kundert, Kenneth S. et al., "Simulation of Nonlinear Circuits in the Frequency Domain", IEEE Transactions on Computer-Aided Design, vol. Cad-5, No. 4, Oct. 1986, pp. 521-535.
Nguyen, H.V. et al., "Direct Phase-Domain Modelling of Frequency-Dependent Overhead Transmission Lines", IEEE Transactions on Power Delivery, vol. 12, No. 3, Jul. 1997, pp. 1335-1342.
Halen, Paul Van et al., "SPICE-Compatible Behavioral-Phase-Space Simulation Techniques for Phase-Locked Systems", IEEE 1996, pp. 53-56.
Chaivipas, Win et al., "On-Chip Tuning of RF Active Filters", GIGAHERTZ 2003, Nov. 6, 2003, XP002504750.

* cited by examiner

*Primary Examiner* — Phallaka Kik
(74) *Attorney, Agent, or Firm* — Park, Vaughan, Fleming & Dowler LLP

(57) ABSTRACT

Embodiments in the present disclosure pertain to domain translators. A domain translator converts a variable from one domain to a different domain. Domains include, but are not limited to, voltage, current, frequency, phase, delay, and duty-cycle. In particular, domain translators enable conversion between standard voltage and current domains commonly used by circuit simulators to other domains such as frequency, phase, delay, duty-cycle, etc., so that linear analysis can be performed on a wide range of circuits that exhibit linear behavior in domains other than voltage and current.

29 Claims, 23 Drawing Sheets

```
module phase2v (phin, vout);
input phin;
output vout;

// parameter definitions omitted for brevity analog begin
    V (sine) <+ cos (2*M_PI*freq*$abstime + V (phin));
    if (V (sine) > 0.0) V (vout) <+ Vhigh;
    else V (vout) <+ Vlow;
end
endmodule
```

FIGURE 4

```
module phase2v (phin, vout);
input phin;
output vout;

// parameter definitions omitted for brevity analog begin
    V(sine) <+ cos (2*`M_PI*freq*$abstime + V(phin));
    V(vout) <+ Voffset +
              Vamplitude*tanh (alpha*V(sine)) ;

end
endmodule
```

FIGURE 6

```
module delay2v (delayin, vin, vout);
input delayin, vin;
output vout;

// parameter definitions omitted for brevity analog begin
    V (x1) :  ddt (V (x1) )  == 1.0/V (delayin) *
                               (-20.05*V (x1)-14.54*V (x2)-12.51*V (x3)
                               -6.286*V (x4)-5.707*V (x5)+4.0*V (vin)) ;
    V (x2) :  ddt (V (x2) )  == 16.0 * V (x1) / V (delayin) ;
    V (x3) :  ddt (V (x3) )  == 8.0 * V (x2) / V (delayin);
    V (x4) :  ddt (V (x4) )  == 8.0 * V (x3) / V (delayin) ;
    V (x5) :  ddt (V (x5) )  == 2.0 * V (x4) / V (delayin) ;

V (vout) <+ 1.310*V (x1) -1.608*V (x2) +1.986*V (x3)
              -1.283*V (x4) +1.427*V (x5) ;
end
endmodule
```

FIGURE 10

TRANSFORMING VARIABLE DOMAINS FOR LINEAR CIRCUIT ANALYSIS

BACKGROUND

Today, integrated circuits are extremely complex in design and layout. Even the most knowledgeable circuit designers, working with state-of-the-art software design tools, find it difficult to predict how their circuit designs will actually perform. The high costs associated with semiconductor photolithography and fabrication techniques make it imperative that the circuit design is working as close to optimal parameters as feasible, before the circuit design is committed to manufacturing. Hence, circuit designs are subjected to rigorous testing before being finalized.

One method to test circuit designs is to use a circuit simulator. Basically, a circuit simulator is a powerful computer program that is used to check the integrity of circuit designs and to simulate their behavior. The circuit to be tested is input as a netlist. This netlist defines the individual circuit elements (e.g., transistors, resistors, capacitors, etc.) and how they are connected together. The circuit simulator then generates a mathematical model based on the netlist, that is used to define and predict the behavior of the circuit.

One of the most common circuit simulator programs is known as SPICE (Simulation Program with Integrated Circuit Emphasis). SPICE and other similar types of circuit simulators offer various types of simulations (also referred to as "analyses"). One analysis, called transient analysis, computes time-domain responses of a circuit to arbitrary voltage or current excitations. Transient analysis is versatile and capable of simulating a wide range of characteristics of a circuit, including both linear and nonlinear characteristics. However, transient analysis is inefficient in characterizing the circuit response to a wide class of input excitations (e.g. response to a step, ramp, sinusoid at various frequencies, or combinations thereof), mainly because it computes a response to one particular set of excitations. In order to obtain all the responses with respect to all the possible excitations of interest, a transient analysis must be performed for each possible set of excitations. Furthermore, the time-domain, non-linear simulation algorithms used by transient analysis tend to be slower than other analyses in SPICE (e.g. DC or AC analyses).

Another analysis, called AC analysis, computes a steady-state response of a circuit for small-signal sinusoidal excitation at a certain frequency. With small-signal sinusoidal excitation, the amplitude of the applied sinusoid is infinitesimally small. For small-signal sinusoidal excitations, all circuits exhibit linear responses determined by their operation point (e.g. DC bias condition). In other words, the response of the circuit is also sinusoidal at the frequency equal to the frequency of the applied input sinusoid. Therefore, the output steady-state sinusoidal response is represented by two real numbers (magnitude and phase), or equivalently by a complex number $(A*\cos(\Phi)+jA*\sin(\Phi))$, where A is the magnitude, $\Phi$ is the phase, and j is $\sqrt{(-1)}$).

In most AC analyses, the steady-state response is computed over a set of frequencies. This results in a set of corresponding steady-state responses as an output (i.e., the set of complex numbers corresponding to each input frequency). With enough frequency points covering the range of interest, this set of complex numbers can estimate a characteristic called a "transfer function," which represents the linear response of the circuit determined by the circuit's operating point at various excitation frequencies. In essence, a transfer function is a frequency-domain representation of the linearized response (the response of the circuit to infinitesimally small excitation), which is also defined as the Fourier transform of the impulse response in linear system theory.

Since a transfer function is a complete description of the linearized response of a circuit biased at a given operating point, a circuit designer can deduce the response of the circuit to a small-signal arbitrary excitation waveform using the transfer function without using explicit transient analysis. For example, if an amplifier has a transfer function of a low-pass filter, that is the transfer function has almost constant high values at low frequencies (called "gain"), but has decreasing values as the frequency increases beyond a certain point (called "bandwidth), then a designer can deduce without running a transient simulation that when a step input is applied to the circuit, the circuit response will initially be a slowly-changing value determined by the bandwidth but will eventually settle at a constant value determined by the gain. Since AC analysis is much more efficient to compute compared to transient analysis, AC analysis is preferred to transient analysis as long as the linear response of the circuit is of concern.

Almost all SPICE-like circuit simulations adopt algorithms (e.g. nodal analysis, modified nodal analysis, etc.) that formulate the circuit network topologies into mathematical equations with node voltages or branch currents as variables. Therefore, the small-signal excitation in AC analysis always meant the small-signal excitation in a voltage or current. Likewise, the linear response of the circuit always meant the response in an output voltage or current. Unfortunately, such an assumption limits the application of AC analysis only to circuits that have meaningful linear responses with voltages or currents as their input and output variables. Those examples include amplifiers, passive or active filters, equalizers, etc. And only these circuits exploited the efficiency of AC analysis.

Another limitation of AC analysis is that it can only compute the linear response at a fixed (DC) operating point. Circuits, such as mixers, used in RF transceivers do not have a DC operating point. Instead, these circuits use a periodically varying operating point that is controlled by the input large-swing clock.

Recent advances in circuit simulators extend the applicability of AC analysis to periodic circuits including the mixer mentioned above. The new analysis, called PAC analysis (Periodic AC) essentially computes a steady-state response of a periodically time-varying circuit (e.g., a circuit driven by a periodic clock such as mixers, switched-capacitor circuits, etc.) to a small-signal sinusoidal excitation (the periodicity of the circuit may not coincide with the frequency of the sinusoidal excitation). The PAC analysis results in a periodically time-varying linear response of a circuit. The periodic steady state of the periodic circuit with no sinusoidal excitation (referred to as PSS later on) can be expressed in a form of Fourier series (i.e., a sum of harmonics or sinusoidal components of integer multiples of the fundamental frequency which is equal to 1/period). The periodically time-varying transfer function can be alternatively represented by a set of multiple transfer functions each of which correspond to the amplitude and phase change of each harmonic of the periodic steady-state response.

While PAC analysis overcame the limitation of AC analysis being applicable to only fixed DC operating points, the limitation of using only voltage or current variables in computing the linear response still remains. All circuits exhibit linear responses to small-signal excitations, but not all of the linear responses are useful or meaningful to the designers. For example, a phase-locked loop does not convey useful information directly when its linearized response to a small-signal sinusoidal change in the input clock voltage is simulated via PAC analysis. This is because the main characteristics of the PLL manifest themselves as being strongly nonlinear when the PLL is analyzed in a voltage domain.

Some circuits and systems do convey useful information in their linear responses when the responses are analyzed in other variables than voltage or current. For example, a PLL mentioned in the previous paragraph is usually designed with a desired transfer function (linear response) between the input clock phase and output clock phase. If designers can simulate the PLL transfer function in phase domain, in other words, compute the steady-state response of the PLL output clock phase to the small-signal sinusoidal change in the input clock phase, the resulting information is of great use to the designers. One can compare the simulation results with the desired transfer function (e.g., bandwidth and damping factor) and verify if the circuit is properly designed to the intended specification. Other examples are delay-locked loops (DLLs), frequency-locked loops (FLL), and duty-cycle correctors (DCCs), which have meaningful linear responses in variables other than voltage or current, such as delay, frequency, and duty-cycle of a clock, respectively.

For the types of circuits that are non-linear in voltage or current as input and output but linear in other variables, designers have been using transient analysis instead of AC analysis to perform the linear analysis in the desired variable domains. One possible method is to run a set of transient analyses that apply the small-signal sinusoidal excitation as time-domain waveform and measure the resulting amplitude and phase of the output sinusoidal-like waveform. This is not a perfect sinusoid because infinitesimally small signal cannot be described with finite resolution. Thus, the sinusoid is just "reasonably" small in amplitude. The magnitudes and phases of the input and output sinusoids give estimates on the transfer function. An alternate method is to apply a test waveform other than a sinusoid (e.g., step, ramp, or short pulse) and estimate the transfer function based on the circuit response via some linear estimation techniques. However, this process of estimating the linear response via transient analysis is an extremely slow and computationally intensive procedure as compared to that of AC or PAC analysis. Although transient analysis is slow, cumbersome, and consumes a great amount of processing power, circuit designers are faced with no other viable solution.

BRIEF DESCRIPTION OF THE DRAWINGS

The accompanying drawings, that are incorporated in and form a part of this specification, illustrate embodiments discussed below, and, together with the description, serve to explain the principles of the disclosure:

FIG. 2($b$) illustrates a block diagram of the application of variable domain translators for converting a phase-domain macromodel of a PLL to a voltage-domain model.

FIG. 4 illustrates an example for a phase-to-voltage translator that does not propagate the perturbation correctly.

FIG. 5($b$) shows an instance of propagating perturbations through a soft decision element.

FIG. 6 sows Verilog-A codes for a phase-to-voltage translator.

FIG. 8($b$) shows a simulated supply sensitivity function of a PLL.

FIG. 9($b$) shows a voltage-to-frequency translator.

FIG. 10 shows Verilog-A codes for a delay-to-voltage translator.

FIG. 11($b$) is a functional diagram of a periodic voltage-to-delay translator.

FIG. 12($b$) shows a Type-I DLL for characterizing a delay domain transfer function.

FIG. 12($c$) shows a Type-I DLL for characterizing a phase domain transfer function.

FIG. 13($b$) shows the simulated transfer function of a DLL for a phase domain.

FIG. 16($b$) shows the simulated transfer function of a DCC for supply sensitivity.

DETAILED DESCRIPTION

Figure 1:
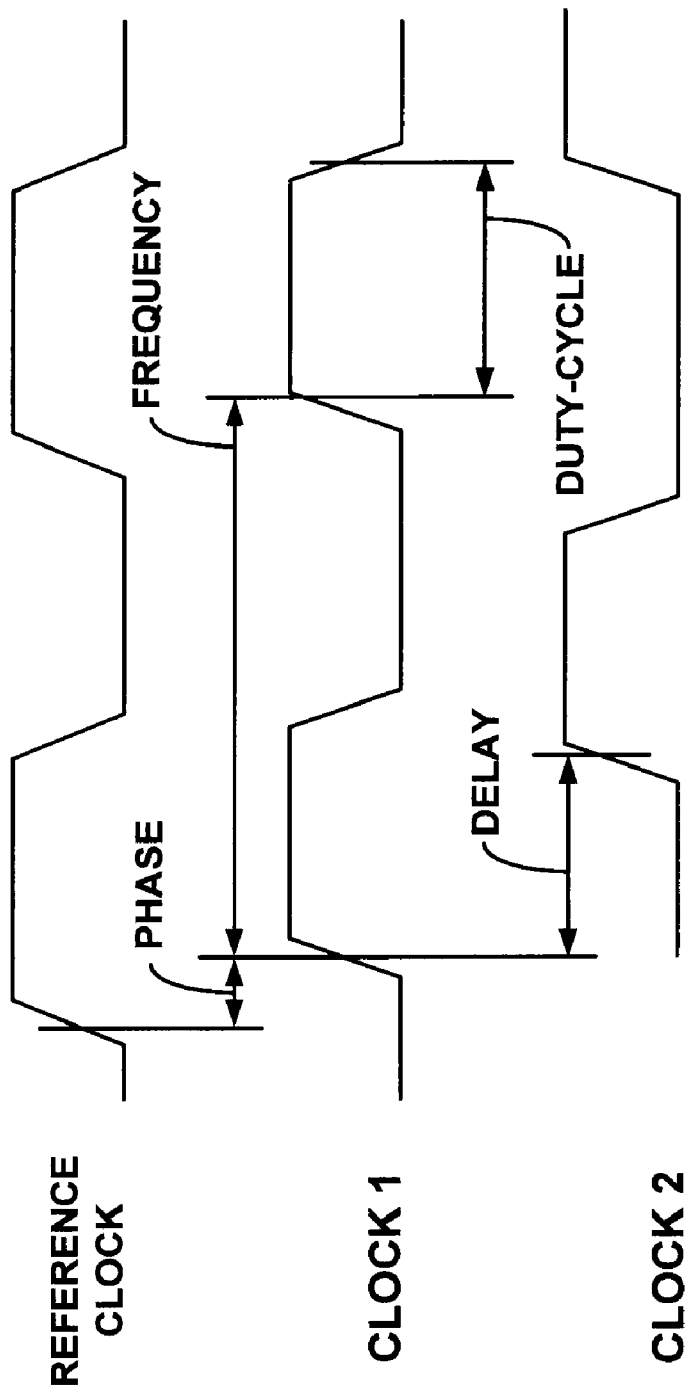
FIG. 1 illustrates various properties of a clock waveform.

Embodiments in the present disclosure pertain to performing AC analysis in variables other than node voltage or branch current of the circuit. More than one variable domains may exist to describe the characteristics of an electrical signal. For example, one method to describe a periodic clock signal is its voltage waveform over time. In this case, the chosen variable domain is voltage. Another method would be the waveform of the clock's phase. In this case, the chosen variable is phase. Notice that the phase domain representation of the clock signal does not explicitly express the periodic waveform of the clock signal. It is rather implicitly assumed by the designer that the clock signal has a known periodic waveform such as a sinusoid, square-wave, trapezoidal wave, etc. or that the designer does not care about the detailed description of the waveform for the scope of the linear analysis in the chosen variable domain. Similarly, a clock signal can be represented by a waveform of the clock's frequency, duty-cycle, or delay compared to another clock with nearly equal frequency. The waveform in these different variable domains may be expressed in time domain or in frequency domain.

Verifying a circuit against the desired behaviors and characteristics is of critical interest to designers. To do so, designers often rely on numerical circuit simulators, such as SPICE, since accurate device model equations are too complex to solve by hand. As the circuit size grows, designers demand the higher efficiency in validating their circuits. While transient analysis in SPICE is the a versatile method of simulating the circuit response to arbitrary excitations, it is also one of the most time-consuming method. On the other hand, AC analysis is the most efficient method of characterizing the linear behavior of a circuit, but it can only be applied to a small class of circuits that are linear in voltage or current, such as amplifiers and filters. Hence embodiments of the present disclosure describe an apparatus and method that can extend the AC analysis to circuits that are nonlinear in voltage or current such as phase-locked loops (PLLs) and delay-locked loops (DLLs), but that are linear in other variables such as phase, frequency, delay, or duty-cycle. With various embodiments, the circuit's linearized response in the chosen variables can be simulated efficiently without relying on extensive transient simulations.

It is noteworthy that many analog and mixed-signal circuits are designed to be linear in operation. In other words, these circuits strive to behave as linear systems and minimize their nonlinearities. For example, a typical design specification for a linear active filter describes the desired behavior of the filter in frequency domain, such as passband, stopband, gain, bandwidth, poles/zeros, Q-factor, etc., which are properties of a linear system. The specification also lists the measures of nonlinearities such as offset, slew rate, dynamic range, distortion, inter-modulation, etc., as quantities to be minimized to zero or maximized to infinite. Such circuits that are linear by intent can be effectively modeled as weakly nonlinear systems.

AC analysis in SPICE is an efficient method of characterizing the linear time-invariant (LTI) response of a circuit at a given DC bias point. AC analysis basically computes the steady-state response of the circuit to single-frequency sinusoidal excitations. Instead of simulating the response in the time domain, it first linearizes the circuit at the DC operating point and then applies frequency-domain phase analysis to compute the response, achieving much greater efficiency in computation. The responses at different frequencies are calculated simply by changing the $j\omega$-term in the complex Jacobian matrix and no iterations are required. With enough frequency points, the transfer function is obtained, which completely characterizes the linearized response of the circuit under test. That is, the transfer function can tell how the circuit responds to an arbitrary excitation, as far as the small-signal response is concerned. Therefore, AC analysis can be regarded as a formal verification method for linear analog circuits as it can prove if the circuit has the correct linear behavior as intended. On the other hand, transient analysis can only compute the circuit's response to one particular excitation at a time. Hence it is far less efficient in obtaining the equivalent transfer function.[1]

Some circuits are linear by intent in a periodically time-varying (PTV) sense and their linear responses can be efficiently characterized by periodic AC (PAC) analysis available in RF circuit simulators, such as ADS, SpectreRF, and HSPICE-RF. Instead of linearizing the circuit at a DC operating point, PAC analysis linearizes the circuit over its periodic steady-state (PSS) response. The result is a periodically time-varying (PTV) transfer function, or equivalently a collection of LTI transfer functions between the different sidebands of the input and output signals. However, for most circuits in this category, designers are interested in one particular LTI transfer function. For example, an up-conversion mixer is characterized by an LTI transfer function between the input baseband and the output passband (i.e. the sideband centered at the fundamental frequency of the carrier). Similarly, the main behavior of a switched-capacitor filter is characterized by the LTI transfer function between the input and output basebands. These circuits are PTV linear because they are driven by a clock that modulates their states periodically and thus have no DC steady-states.

Some periodic circuits are linear by intent in variables other than voltage or current. Examples are PLLs, DLLs, and duty-cycle correctors (DCCs), which have the desired linear transfer functions expressed in phases, delays, and duty-cycles of the input and output clocks, respectively. FIG. 1 illustrates various properties of a clock waveform that may be of designers' interest. Since it is the linear transfer function that is to be measured, one might expect that the AC or PAC analysis can be applied to characterize the linear response of such systems with these non-voltage variables being the input or output.

However, AC and PAC analyses cannot directly compute the linearized response for small-signal perturbations in non-voltage/current variables. It is mainly because SPICE chooses node voltages and branch currents as state variables when it builds the state-space equation models from the circuit netlists (e.g. modified nodal analysis (MNA). Hence, SPICE implicitly assumes that all variables in the AC and PAC analyses are either voltage or current, and can only compute the transfer functions in voltages or currents accordingly. Besides, the circuits like PLLs and DLLs have been considered strongly nonlinear when viewed from the voltage perspective. Thus, designers have either relied on transient analysis and/or used component-level macromodeling approaches to characterize the transfer functions in the desired variable domains.

Embodiments pertain to a method to directly apply the PAC analysis to various variable domains. The method uses variable domain translators, which can properly convert the perturbation in one variable to a perturbation in another. These variable domain translators enable non-voltage variables to be expressed as pseudo-voltages, so that the traditional PAC analysis can apply small-signal perturbations and measure the responses in these variables as if they were voltages. The transfer functions in the desired variable domains such as the phase transfer function of a PLL can be simulated directly and efficiently from the transistor-level circuit description. Furthermore, macromodeling these circuits that were previously considered strongly nonlinear is now more straightforward with these variable domain translators, since the circuit behavior can be first modeled as weakly-nonlinear systems in the selected variable domains, which can then be converted to the voltage domain for the macromodel to interface with the other circuits or models.

In one embodiment, a method to perform linear AC analysis on mixed-signal systems which appear strongly nonlinear in the voltage domain but are linear in other variable domains is disclosed. Common circuits, such as phase/delay-locked loops and duty-cycle correctors fall into this category, since they are designed to be linear with respect to phases, delays, and duty-cycles of the input and output clocks, respectively.

The method uses variable domain translators to change the variables to which the AC perturbation is applied and from which the AC response is measured. By utilizing the efficient periodic AC (PAC) analysis available in commercial RF simulators, the circuit's linear transfer function in the desired variable domain can be characterized without relying on extensive transient simulations. Furthermore, the variable domain translators enable the circuits to be macromodeled as weakly-nonlinear systems in the chosen domain and converted to voltage-domain models, instead of being modeled as strongly-nonlinear systems directly.

Designers may be interested in the linearized response in the output variables other than voltage or current and/or with respect to the small-signal change in the variables other than voltage or current. For example, a PLL designer may be interested in the linearized response of the phase of the PLL output clock to the small-signal change in the input clock phase. Similarly, a DLL designer may be interested in the linearized response of the delay of the DLL output clock to the small-signal change in the input clock delay or period. Traditionally, the designers had to resort to time-consuming, computationally-intensive transient analysis to simulate the linearized response in variables other than voltage or current, because many SPICE-like simulators allow only node voltages or branch currents as input and output variables in the AC or PAC analysis.

The embodiments describe performing the linear analysis for circuits such as a PLL or a DLL whose linearized response is of interest in variables other than voltage or current by using variable domain translators. By using these domain translators, the AC analysis in non-electrical (neither voltage nor non-current) variables can be performed in the SPICE-like circuit simulators that can perform AC/PAC analysis only in electrical variables (voltage or current). Some translators take an original signal (e.g. clock signal in voltage) as input and produce an artificial voltage or current signal that is indicative of interested characteristics of the original signal (e.g. phase, frequency, delay, duty-cycle, etc.). Some other translators take an artificial voltage or current signal indicative of the interested characteristics (e.g. phase, frequency, delay, duty-cycle, etc.) and produce a voltage representation of the signal bearing such characteristics (e.g. clock waveform in voltage). As these non-electrical variables are expressed as artificial voltages or currents, the circuit simulator can perform linear analysis using AC or PAC analysis in these non-electrical variables (but it thinks it is doing it in voltage/current variables). As the end result, designers can obtain the transfer function (linearized response) of the circuit having those non-electrical variables as the input or output.

Embodiments in the present disclosure pertain to variable domain translators. A domain translator converts a variable from one domain to a different domain. Domains include, but are not limited to, voltage, current, frequency, phase, delay, and duty-cycle. In particular, domain translators enable conversion between standard voltage and current domains commonly used by circuit simulators, such as SPICE, to other domains such as frequency, phase, delay, duty-cycle, etc., so that linear analysis can be performed on a wide range of circuits that exhibit linear behavior in those other domains. Existing circuit simulators, by themselves, cannot perform linear analysis on certain types of circuits. Specifically, existing circuit simulators cannot perform linear analysis on circuits that are non-linear in the voltage or current domain (e.g., oscillators, phase-locked loops, delay-locked loops, duty-cycle correctors, etc.). But with the introduction of these variable domain translators, used in conjunction with the existing circuit simulators, these circuits can now be simulated by means of linear analysis rather than by the more time-consuming and computationally intensive transient analysis. This is made possible because the domain translators extend the functionality of existing circuit simulators. Essentially, a domain translator takes an input that is not voltage or current and converts it into standard voltage or current that are understood and used by existing circuit simulators. The converted voltage or current is representative of the non-voltage or current input. This converted voltage or current is then used by the circuit simulator to perform standard linear analysis on the circuit under test. Another domain translator can optionally be used to convert the voltage or current output from the circuit simulator back to the domain of interest (e.g., frequency, phase, delay, duty-cycle, etc.). Thus, the domain translators enable existing circuit simulators to perform linear analysis on circuits in domains other voltage or current domains. In other words, by using one or more domain translators, existing circuit simulators can be used to perform linear analysis on virtually any type of circuitry, such as oscillators, phase-locked loops, delay-locked loops, duty-cycle correctors, etc., which hitherto had been limited to transient analysis. It should be noted that virtually any circuit can have linear analysis performed by using one or more appropriate domain translators. Different domain translators can be designed to meet the specific requirements of the circuits being linearly analyzed. Furthermore, it should be noted that the linear analysis enabled by the domain translators includes AC analysis and also periodic AC analysis (PAC).

In one embodiment, a variable domain translator is a pseudo-circuit block that converts a quantity expressed in one domain into an equivalent quantity in another domain. For example, a phase-to-voltage translator takes a phase value as an input and produces a clock voltage waveform with the corresponding phase as the output. Similarly, a voltage-to-phase translator takes a clock voltage waveform as an input and produces its phase as the output. Note that the non-voltage quantities (e.g., phase) will be treated as voltages by the simulator, since voltage and current are the only types of variables handled by SPICE-like simulators. It should be noted that Verilog-A can support non-electrical variables such as phase, but they are eventually converted to voltage/current variables in the modified nodal analysis (MNA) matrix or internal variables inside the evaluation model. To illustrate this, a pseudo-voltage representing a phase may have a 1V value perceived by the simulator, but it signifies 1 radian (or a scale factor can be assumed). Treating non-voltage variables as pseudo-voltages allows the circuit simulator to apply perturbations to and measure the AC responses in these variables.

Figure 2A:
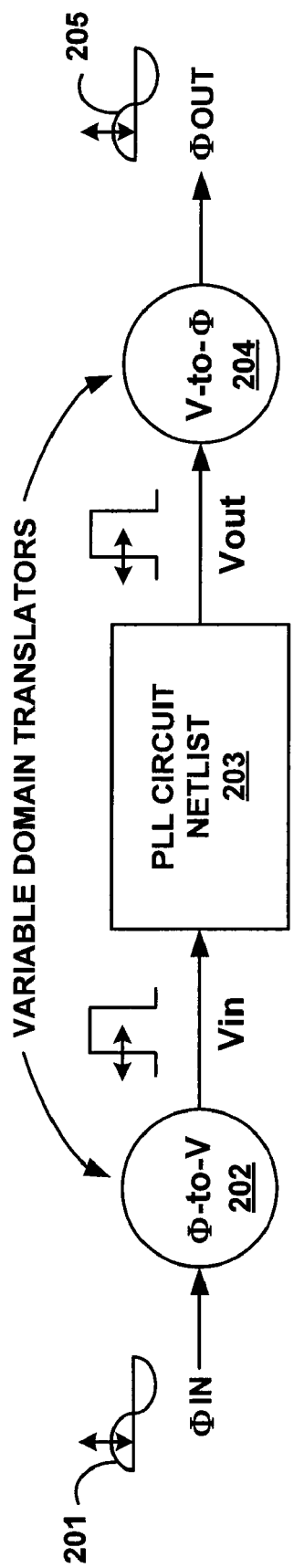
FIG. 2($a$) illustrates a block diagram of the application of variable domain translators to perform a phase-domain AC analysis on a PLL.

FIG. 2(*a*) illustrates a block diagram of the application of variable domain translators to perform a phase-domain AC analysis on a PLL. An AC perturbation source 201 is applied to the input of a phase-to-voltage translator 202, which converts the perturbation in phase to the equivalent perturbation in the input clock waveform of the PLL circuit netlist 203. Also, a voltage-to-phase translator 204 added at the PLL output converts the resulting perturbation in the output clock waveform in voltage to the perturbation in the output phase. Hence, the phase-domain linear transfer function can be measured directly by probing the AC response 205 on the output phase pseudo-voltage node, after the PAC analysis.

The variable domain translators can also help macromodel these seemingly-nonlinear circuit systems like PLLs. Since these circuits appear strongly nonlinear in voltage but are almost linear (i.e. weakly nonlinear) in the selected variable domains, the circuit is modeled first as a weakly-nonlinear system in the selected variables, based on various weakly-nonlinear models and then converted to a voltage-domain model using the translators.

Figure 2B:
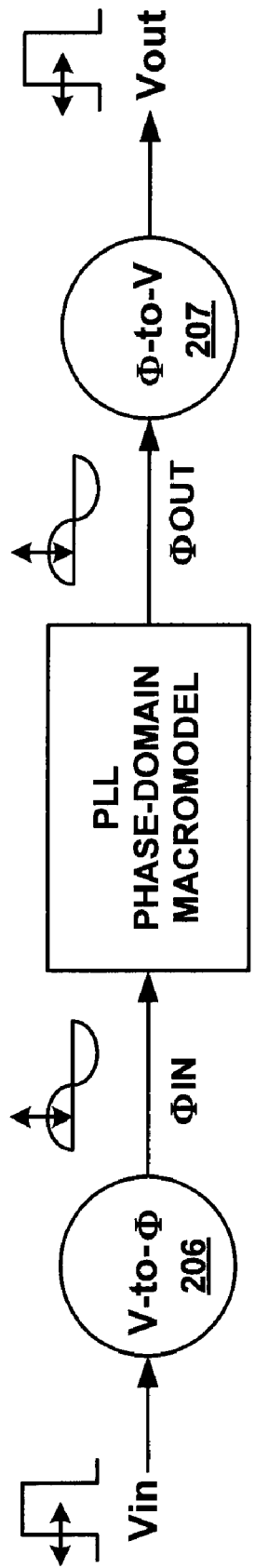

FIG. 2(b) illustrates a block diagram of the application of variable domain translators for converting a phase-domain macromodel of a PLL to a voltage-domain model using the voltage-to-phase translator 206 and phase-to-voltage translator 207. The phase-domain macromodel can be generated algorithmically from the phase-domain pseudo-circuit in FIG. 1. In one embodiment, a modified Volterra series approach is used to generate the macromodels from the PSS and PAC simulation results directly.

Figure 3:
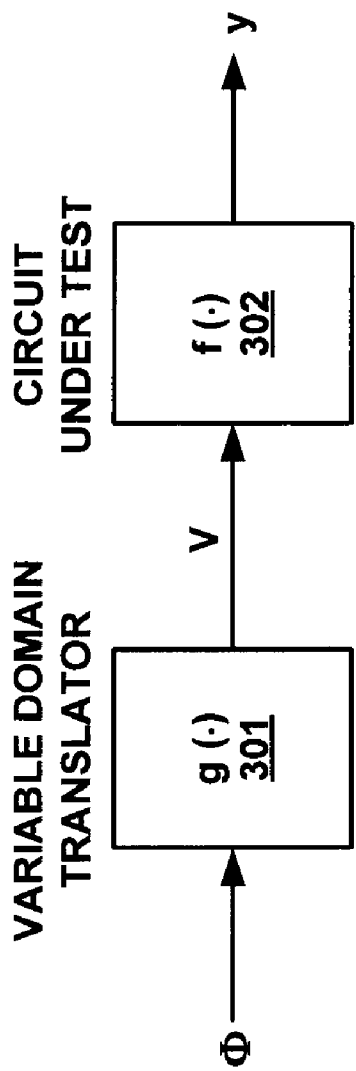
FIG. 3 shows an example of an input variable domain translator.

The requirements for a variable domain translator in one embodiment are now disclosed. A circuit with an input variable vector v and an output variable vector y can be expressed in a general nonlinear differential equation:

$$f(y,\dot{y})=v, \qquad (1)$$

where $\dot{y}$ denotes the time-derivative of y. FIG. 3 shows an example of an input variable domain translator 301, which is a pseudo-circuit block that replaces the original input variable v with a new variable, (e.g., $\phi$). The analysis can be extended to the output variable domain translator. Similar to EQ(1), one can express the translator in another nonlinear differential equation:

$$g(v,\dot{v})=\phi. \qquad (2)$$

The combination of the variable domain translator 301 and the circuit under test 302 results in a new system between the input $\phi$ and output y, governed by:

$$h(y,\dot{y}) \equiv g(f(y,\dot{y}),\dot{f}(y,\dot{y}))=\phi. \qquad (3)$$

Note that EQ(3) is the equation used by the large-signal transient analysis. Therefore, for the variable domain translator 301 to work properly as intended in transient simulations, it should possess the correct relationship in EQ(2).

On the other hand, the PAC analysis relies on a different circuit equation than the transient analysis. It is assumed that the combined system in FIG. 3 has periodic steady-state (PSS) solutions of $v_s$ and $y_s$ for v and y, respectively. The PAC analysis begins by linearizing the system around the PSS solutions based on a first-order Taylor expansion:

$$h(y_s, \dot{y}_s) + \left.\frac{\partial h}{\partial y}\right|_{y_s} \delta y + \left.\frac{\partial h}{\partial \dot{y}}\right|_{\dot{y}_s} \delta \dot{y} \cong \varphi + \delta\varphi. \qquad (4)$$

Removing $h(y_s,\dot{y}_s)=\phi$ from both sides, one derives a linear equation between the small-signal perturbations on the input and output ($\delta y$ and $\delta\phi$, respectively):

$$\left.\frac{\partial h}{\partial y}\right|_{y_s} \delta y + \left.\frac{\partial h}{\partial \dot{y}}\right|_{\dot{y}_s} \delta \dot{y} = \delta\varphi, \qquad (5)$$

where $\partial h/\partial y$ and $\partial h/\partial \dot{y}$ are Jacobian matrices evaluated at the steady-state solution $(y_s,\dot{y}_s)$ Based on these Jacobian matrices, the PAC analysis performs a frequency-domain analysis to compute the PTV transfer function. By the chain rule, the Jacobian matrices of h can be expanded into sums and products of Jacobian matrices of the subcircuits f and g:

$$\left.\frac{\partial h}{\partial y}\right|_{y_s} = \left.\frac{\partial g}{\partial v}\right|_{v_s} \cdot \left.\frac{\partial f}{\partial y}\right|_{y_s} + \left.\frac{\partial g}{\partial \dot{v}}\right|_{\dot{v}_s} \cdot \left.\frac{\partial \dot{f}}{\partial y}\right|_{y_s}, \qquad (6a)$$

$$\left.\frac{\partial h}{\partial \dot{y}}\right|_{\dot{y}_s} = \left.\frac{\partial g}{\partial v}\right|_{v_s} \cdot \left.\frac{\partial f}{\partial \dot{y}}\right|_{\dot{y}_s} + \left.\frac{\partial g}{\partial \dot{v}}\right|_{\dot{v}_s} \cdot \left.\frac{\partial \dot{f}}{\partial \dot{y}}\right|_{\dot{y}_s}. \qquad (6b)$$

Note that $\partial h/\partial y$ and $\partial h/\partial \dot{y}$ depend on the Jacobian matrices of the translator g, $\partial g/\partial v$ and $\partial g/\partial \dot{v}$, and not necessarily on the large-signal equation $g(v,\dot{v})$ itself. This implies that for the correct translation of perturbations between $\phi$ and v, the translator should satisfy the correct relationship in:

$$\left.\frac{\partial g}{\partial v}\right|_{v_s} \delta v + \left.\frac{\partial g}{\partial \dot{v}}\right|_{\dot{v}_s} \delta \dot{v} = \delta\varphi, \qquad (7)$$

which is the small-signal perturbation equation for the translator. Thus, for the correct operation both in large-signal transient analysis and small-signal PAC analysis, the variable domain translator should satisfy two different equations, EQ(2) and EQ(7), respectively. Moreover, satisfying one does not guarantee satisfying the other. This is true when implementing the translators with ideal circuit elements or in an analog behavioral description language, such as Verilog-A.

While Verilog-A provides a convenient method to write the behavioral description of the variable domain translators, a Verilog-A translator can be written that has the correct operation for the transient analysis but not for the PAC analysis. In other words, the translator has the correct relations only in EQ(2) but not in EQ(7).

Figure 5A:
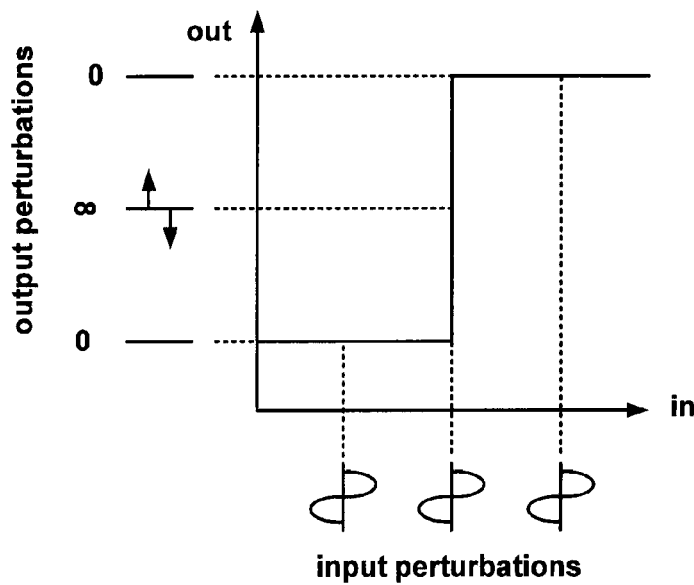
FIG. 5($a$) shows an instance of propagating perturbations through a hard decision element.
Figure 5B:
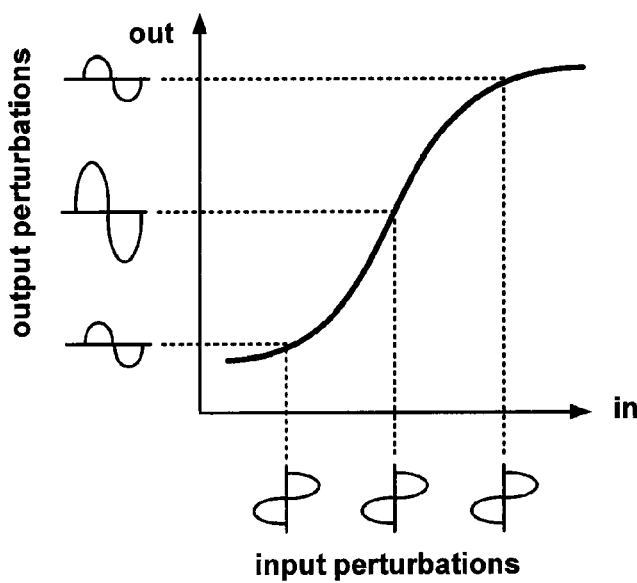

FIG. 4 illustrates an example for a phase-to-voltage translator that does not propagate the perturbation correctly. The translator is described as a phase-modulated sinusoidal source followed by an if-statement that produces a square-wave clock for the output. One may view this if-statement as an ideal slicer as depicted in FIG. 5(a), outputting one fixed value below the threshold and the other above the threshold. Since this ideal slicer has zero gains for all input values except at the threshold where the gain is infinite, it will not properly propagate the perturbation from the input to the output. As a result, this translator has an incorrect PAC response despite its correct transient response. Similar issues arise whenever a hard decision is made; for example, when using ideal switches or event triggers, such as "@cross." These issues are resolved by using smoother decision functions as depicted in FIG. 5(b).

Furthermore, many RF simulators including SpectreRF and HSPICE-RF require that the Verilog-A modules used in the PSS and PAC analyses be free of so-called hidden states. This is because for the PSS analysis to determine if the periodic steady-state solution is reached, it should be able to access all the states in the systems. Some behavioral operators in Verilog-A imply infinite number of states, which make it infeasible for the simulator to determine the steady state. Such operators include ideal delay operator delay and z-domain filters (e.g., "zi_nd"). Ideal delay elements should be avoided by approximating them as finite-order continuous-time filters. While it is possible to realize a discrete-time z-domain filter as an ideal switched-capacitor filter, simulations tend to slow down significantly due to the fast transitioning edges in the sampling clock and the sampled data. It is preferable that the ideal switched-capacitor filters be used sparingly to maintain fast simulation speed.

Embodiments disclosing how to perform AC/PAC analysis in various variable domains including phase, frequency, delay, and duty-cycle is disclosed below, including circuit examples as well as Verilog-A implementations of the variable domain translators that satisfy the above-mentioned requirements.

For phase-domain AC analysis, transforming variable domains enables the characterization of the phase-domain transfer functions of a PLL directly from its circuit netlists using the PAC analysis. Previously, the phase-domain transfer function could only be estimated based on analytical models, phase-domain macromodels, or models fitted to transient simulations.

Prior to PAC analysis, a PSS analysis should be performed to find the periodic steady-state solution of the PLL. The fundamental frequency for the PSS analysis is set to the lowest common divisor frequency in the system, for example, the reference frequency. Although it has been reported that the PSS convergence may consume long hours for PLLs with multiplication factors greater than ten, it has been determined that many PLL simulations can be sped up significantly by macromodeling the VCO or the divider. Note that, in some embodiments, the PSS and PAC analyses cannot be performed on bang-bang controlled PLLs or ΣΔ fractional-N PLLs as they do not have periodic steady states.

FIG. 6 lists the Verilog-A code for the phase-to-voltage translator that correctly propagates the perturbation and thus satisfies EQ(7). Notice that a tan h function is used in place of the ideal slicer in FIG. 4 to sharpen the clock edges and to produce a trapezoid-like clock waveform. The gain factor alpha is determined by the desired maximum edge rate of the output clock:

$$\text{alpha}=1/(\pi \cdot T_{edge,N}) \quad (8)$$

where $T_{edge,N}$ is the transition time normalized to the clock period. As the gain factor alpha becomes too large, the tan h function will start to act like an ideal slicer and stop propagating the perturbation again. For SpectreRF, a $T_{edge,N}$ value of 0.05~0.2 is appropriate.

Figure 7:
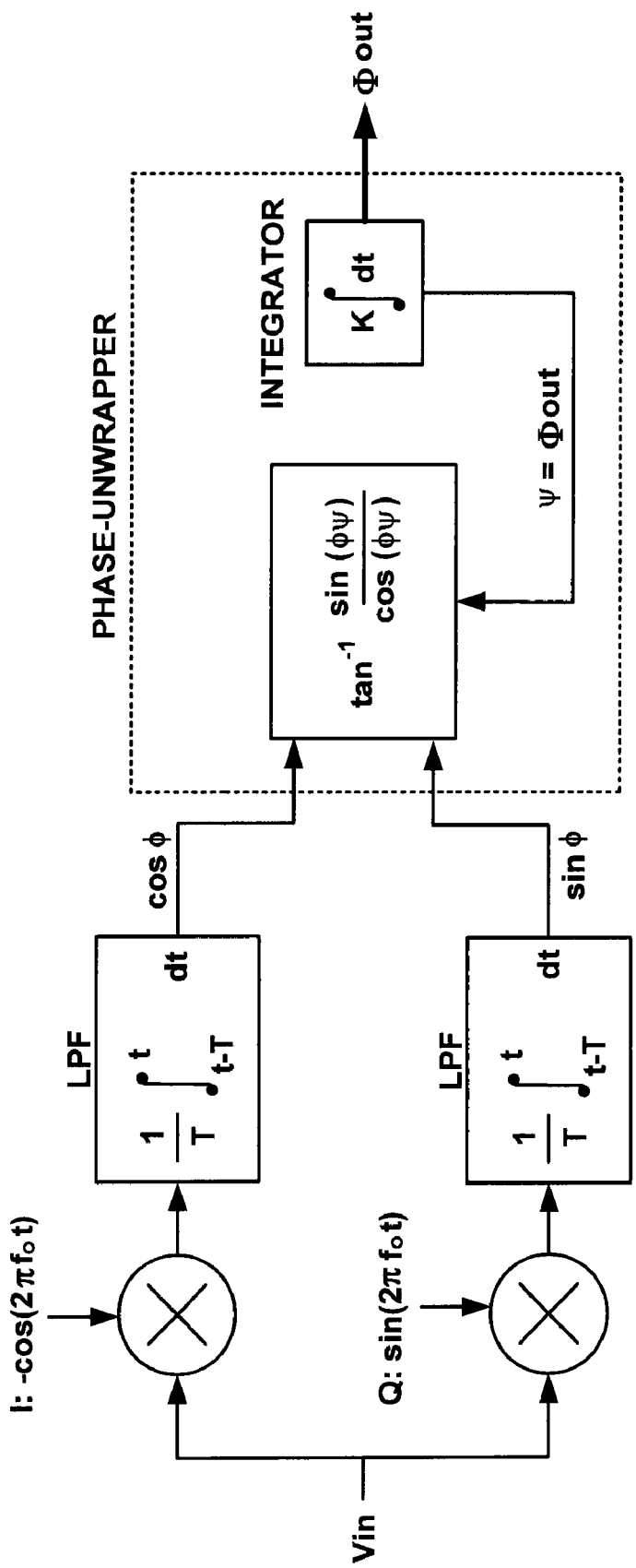
FIG. 7 shows a functional diagram of a voltage-to-phase translator.

FIG. 7 shows a functional diagram of the voltage-to-phase translator. A voltage-to-phase translator is essentially a phase detector that measures the difference in phase between the input clock and the reference clock. The reference clock is implicitly assumed by the reference frequency $f_0$ specified by the user and is generated within the translator. While various methods of realizing ideal phase detection may exist, many of them use event triggers or hard decisions (e.g. if-statements) and thus do not properly propagate perturbations. The translator shown in FIG. 7 is based on I/Q-demodulation. First, the input clock voltage $v_{in}$ is mixed with in- and quadrature-phases of the reference clock and subsequently low-pass filtered by T-long integration, where T is the clock period ($=1/f_0$). Therefore, the resulting signals indicate sine and cosine values of the clock phase, respectively. While one could recover the phase value by computing arctan function of the sine-to-cosine ratio, the arctan function will cause discontinuities in its result values whenever the phase crosses the ±π boundary. To prevent this, an integrator-feedback loop is used that updates the final output phase $\Phi_{out}$ only when the intermediate phase value, $\phi$-$\psi$, changes. Hence, the $\Phi_{out}$ value will always transition smoothly even when the input clock slips cycles. The ideal low-pass filter is in fact not realizable in finite-order systems and thus it is approximated as an eighth-order continuous-time filter based on a system estimation method. The indirect assignment statement supported in Verilog-A can be used in writing the state-space differential equations.

Figure 8A:
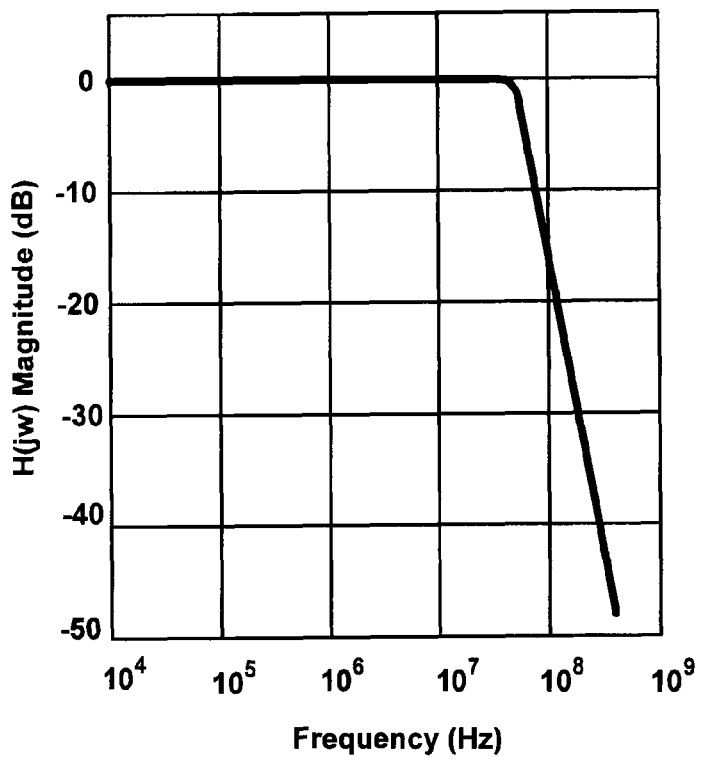
FIG. 8($a$) shows a simulated closed-loop transfer function of a PLL.
Figure 8B:
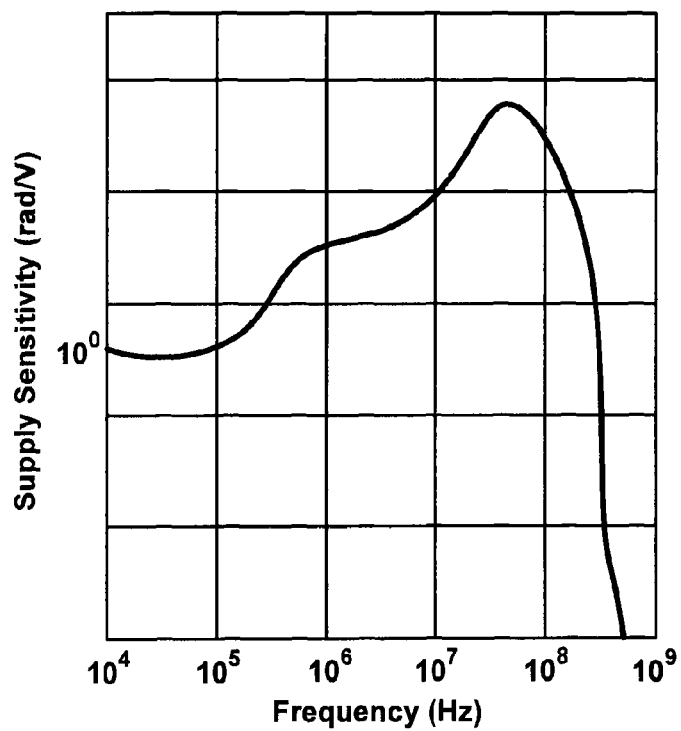
Figure 9A:
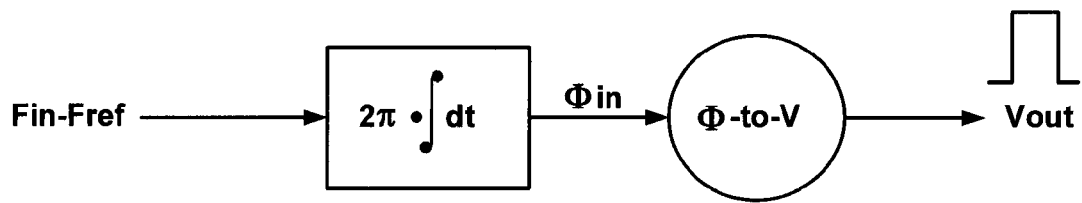
FIG. 9($a$) shows a frequency-to-voltage translator.
Figure 9B:
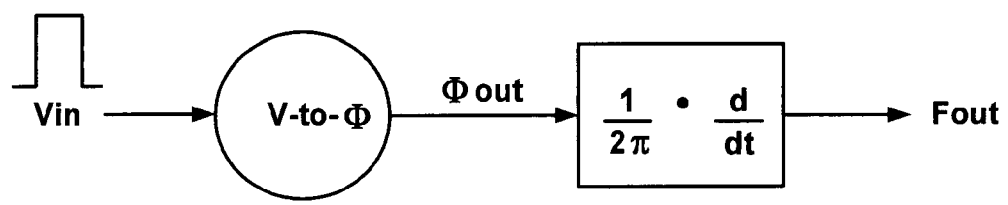

FIG. 8(a) shows a simulated phase-domain transfer function of a PLL using the described phase-domain translators. The PLL under test is a supply-regulated PLL with an inverter-based ring oscillator. The PLL has a multiplication factor of 1 and contains 341 active transistors in 0.13 μm CMOS BSIM3 models. FIG. 8(a) plots the close-loop transfer function H(jω) between the input and output phases directly measured by the PAC analysis. The open-loop transfer function G(jω) can be estimated by G(jω)=H(jω)/(1−H(jω)/N) where N is the multiplication factor. These transfer functions are highly valuable to designers as they indicate the loop bandwidth, damping factor, jitter peaking, and stability measures, such as phase and gain margins. FIG. 8(b) plots the supply sensitivity of the PLL. The sensitivity function shows a bandpass response peaked at the loop bandwidth. This occurs because the low-frequency supply noise is attenuated by PLL feedback while the high-frequency noise is attenuated by the integrating function of the VCO. The low-frequency flat floor corresponds to the supply sensitivity of the output clock buffers that are not within the PLL feedback loop. The frequency-to-voltage and voltage-to-frequency translators can also be implemented using the phase-to-voltage and voltage-phase translators, respectively. This is because frequency is a time-derivative of phase. As illustrated in FIG. 9(a), a frequency-to-voltage translator is a phase-to-voltage translator preceded by an integrator that integrates the difference between the input frequency and the reference frequency. Similarly, as shown in FIG. 9(b), the voltage-to-frequency translator is a voltage-to-phase translator followed by a differentiator.

For delay-domain AC analysis, delay-locked loops are similar to PLLs except that the delay-locked loops adjust the delay instead of the phase of the clock. The linear transfer functions of delay-locked loops can be simulated in a delay domain, using the variable domain translators that convert the perturbations between voltage and delay.

A delay-to-voltage translator is basically a variable delay element that propagates the input voltage vin to the output vout with a time delay specified by the delay input delayin.

FIG. 10 shows the Verilog-A code for a delay-to-voltage translator. As described above, the ideal delay operator delay available in Verilog-A language introduces hidden states that the periodic analysis cannot handle. Instead, the delay is realized with a finite-order continuous-time filter. Such a continuous-time system model can be obtained by approximating the ideal delay H(jω)=exp(−jωT$_D$) up to a specified bandwidth, based on various system identification methods. The differential equations of the approximate delay model can be directly expressed in Verilog-A language. FIG. 10 describes a fifth-order model fitted to an ideal delay, which has a delay-bandwidth product of 1. The delay amount can be modulated by scaling the rate of change in all the state variables with the delay input. In FIG. 10, the time-derivative terms (ddt) are inversely proportional to the delay input V(delayin). As V(delayin) increases, the state variables x1, x2, . . . , x5 vary at the reduced rates, resulting in a longer delay. In this finite-order system, the input-to-output tracking bandwidth is inversely proportional to the delay. If a higher bandwidth is desired, one can increase the delay-bandwidth product by cascading multiple delay elements in series or by approximating the ideal delay to a higher-order system.

Figure 11A:
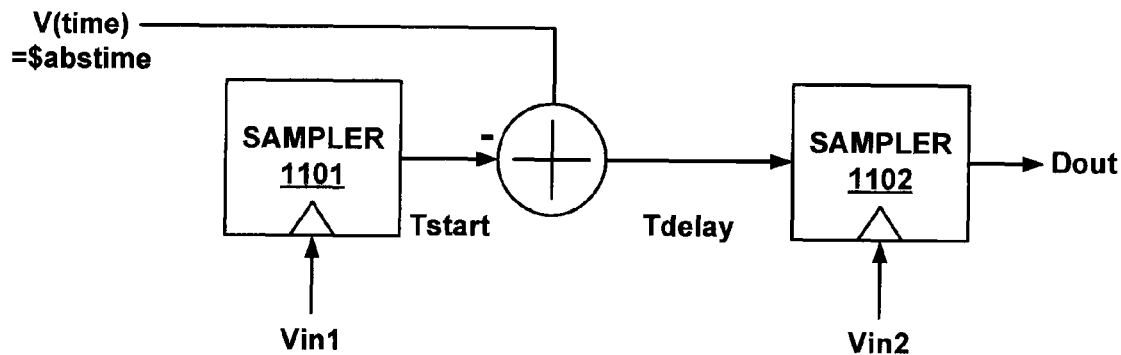
FIG. 11($a$) is a functional diagram of an aperiodic voltage-to-delay translator.
Figure 11B:
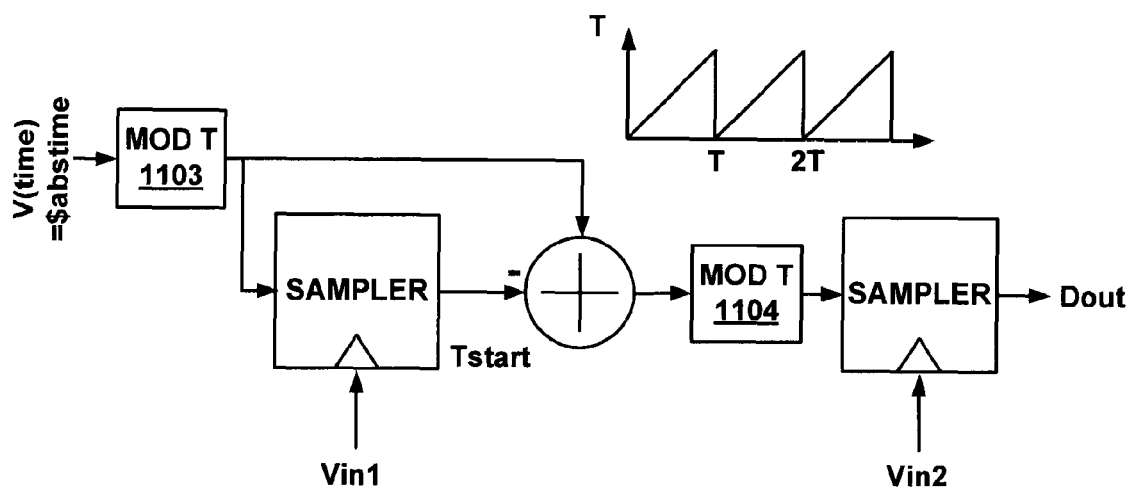

A voltage-to-delay translator takes two binary signals Vin1 and Vin2 as inputs and produces an output Dout that corresponds to the time delay between the two input events (e.g.

rising edge). FIG. 11(a) illustrates an aperiodic method of measuring the delay. Two samplers 1101 and 1102 record the times at which the events occur in Vin1 and Vin2, respectively, and the delay is the difference between the two recorded times. However, this implementation is not amenable to the periodic analysis, because the time signal V(time) continues to grow without bounds. FIG. 11(b) illustrates a method to enforce a periodic steady-state solution by using modulo-T operations 1103 and 1104, where T is the period. The ramp in V(time) is replaced with a sawtooth, which is periodic in T. The samplers can be implemented as a series of two sample-and-hold switches. These ideal switches should switch smoothly to avoid problems of suppressing perturbations as described above.

Figure 12A:
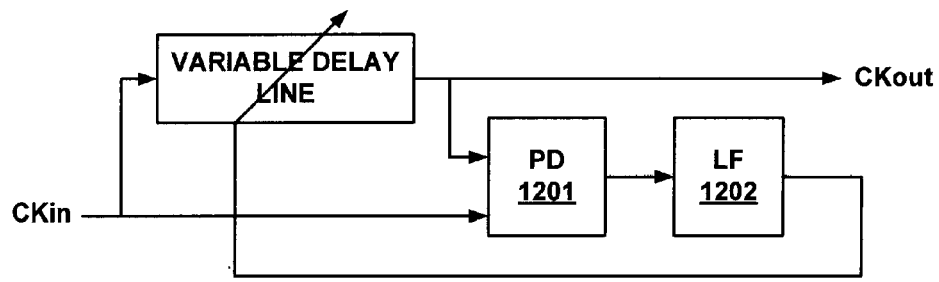
FIG. 12($a$) shows a Type-I DLL architecture.
Figure 12B:
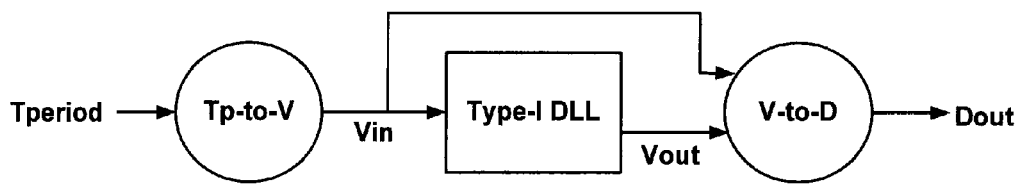
Figure 12C:
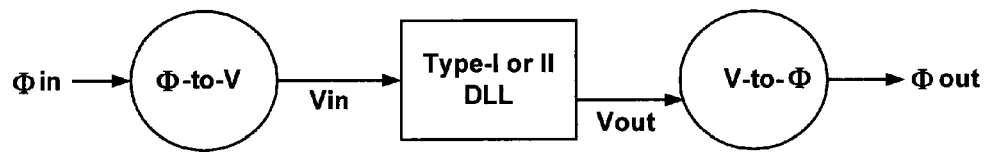

FIG. 12(a) shows the block diagram of a DLL. This is a type-I DLL, which locks the delay of the variable delay line to some fraction of the input clock period (e.g., a half). The output of the delay line CKout is compared against the input clock CKin and the difference drives the feedback loop consisting of a phase detector (PD) 1201 and a loop filter (LF) 1202. Another type of DLL, referred to as type-II, delays a separate reference clock instead of the input clock. For type-I DLLs, designers are interested both in delay-domain and phase-domain transfer functions. From the delay-domain transfer function, designers check if the feedback loop is stable and has the intended bandwidth. In this case, the input delay is implicitly assumed as the input clock period. From the phase-domain transfer function, designers check if there is any excessive jitter amplification due to the latency in the feedback. FIGS. 12(b) and (c) show how to configure the variable domain translators to measure these different types of transfer functions.

Figure 13A:
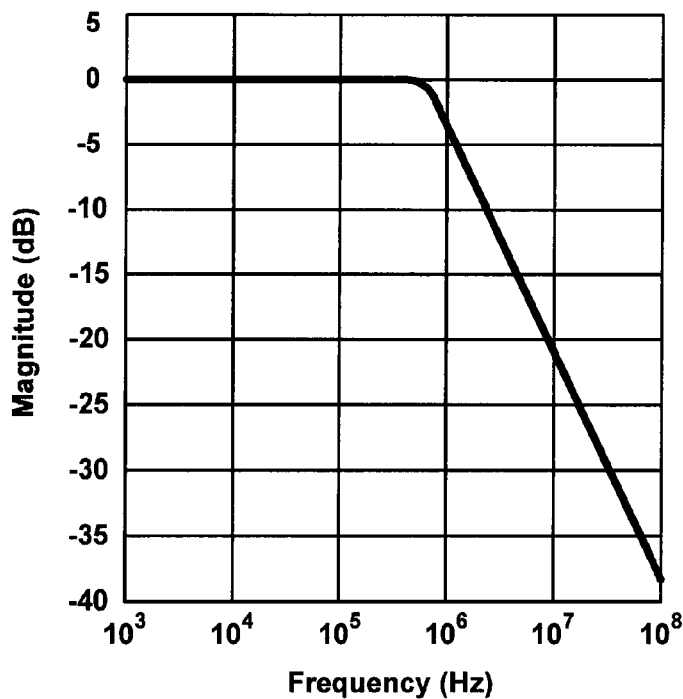
FIG. 13($a$) shows the simulated transfer function of a DLL for a delay domain.
Figure 13B:
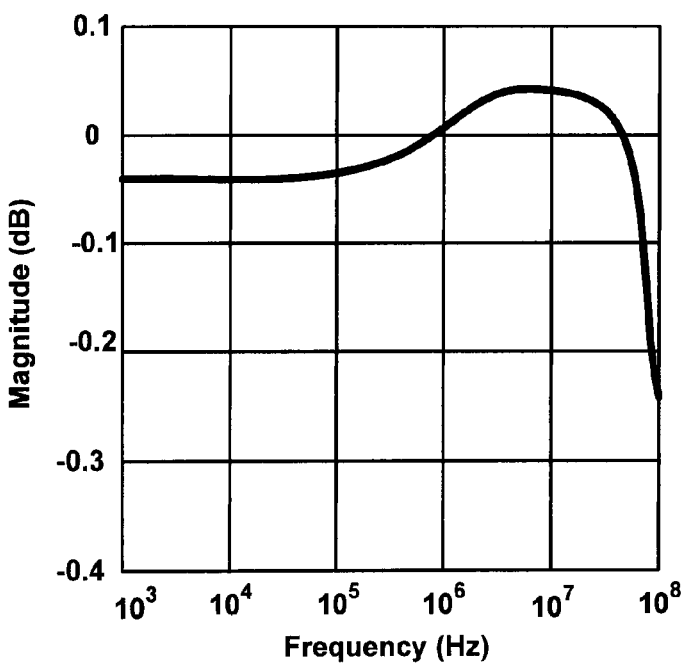

FIG. 13(a) shows a plot of the simulated transfer functions of a Type-I DLL in a delay domain, and FIG. 13(b) shows a plot of the simulated transfer function of a Type-I DLL in a phase domain. The DLL under test was simulated with 0.25 µm CMOS BSIM3 models. The delay-domain transfer function shows a low-pass characteristic while the phase-domain transfer function shows an all-pass with moderate amplification in the midband.

Figure 14:
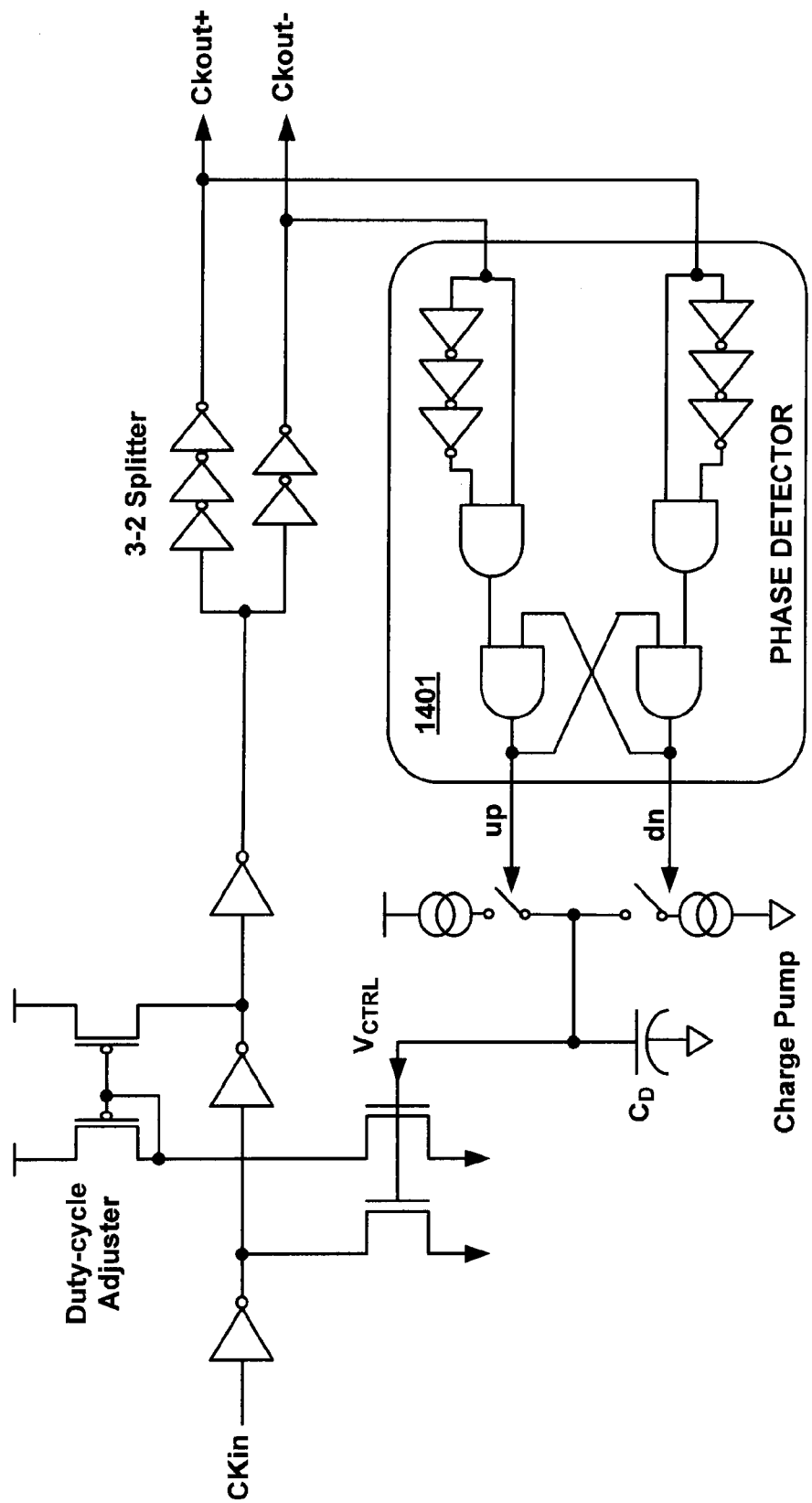
FIG. 14 shows an example of an analog duty-cycle corrector.

For duty-cycle domain AC analysis, a duty-cycle corrector (DCC) is a feedback control circuit that tries to maintain the duty-cycle of its output clock at 50%. The DCC is commonly used in systems where the rising and falling edges of the clock need to be evenly distributed; for example, data transmission based on dual-edge clocking, also referred to as double-data-rate (DDR) transmission. FIG. 14 shows an analog DCC circuit. A phase detector 1401 measures the unevenness of the rising and falling edge distribution and adjusts the control voltage Vctrl accordingly. Based on Vctrl, a duty-cycle adjuster changes the duty-cycle by skewing the pull-up and pull-down strengths of the clock buffer chain. As with other feedback systems, bandwidth, stability, and supply sensitivity are of interest, except that the transfer functions are to be measured in the duty-cycle domain.

Figure 15:
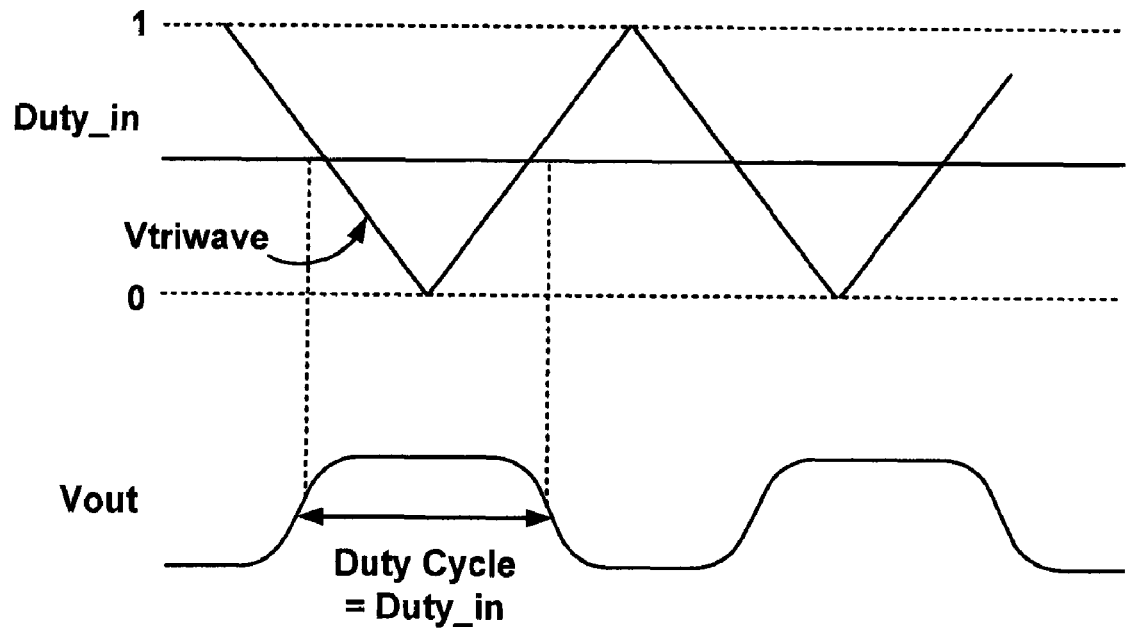
FIG. 15 is a functional diagram of a duty-cycle-to-voltage translator.

FIG. 15 illustrates the operating principle of a duty-cycle-to-voltage translator. A clock waveform with desired duty cycle is generated by comparing a duty-cycle value Duty_in against a triangular wave, Vtriwave, which ranges between 0 and 1 and is periodic in the clock cycle. Similar to the phase-to-voltage translator case, the comparison is softened with the tan h function. The gain factor beta is again determined by the desired edge rate of the output clock: beta=$1/T_{edge,N}$.

For a voltage-to-duty-cycle translator, the clock-high period is measured as the delay between the rising edge and the falling edge of the input clock using a voltage-to-delay translator, and then the output duty-cycle is computed as the clock-high period divided by the clock period.

Figure 16A:
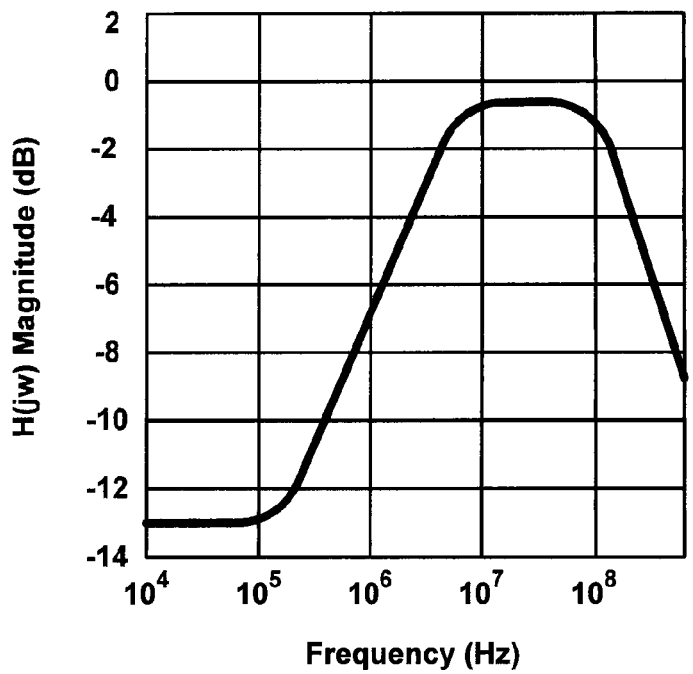
FIG. 16($a$) shows the simulated transfer function of a DCC from input to output duty-cycle.
Figure 16B:
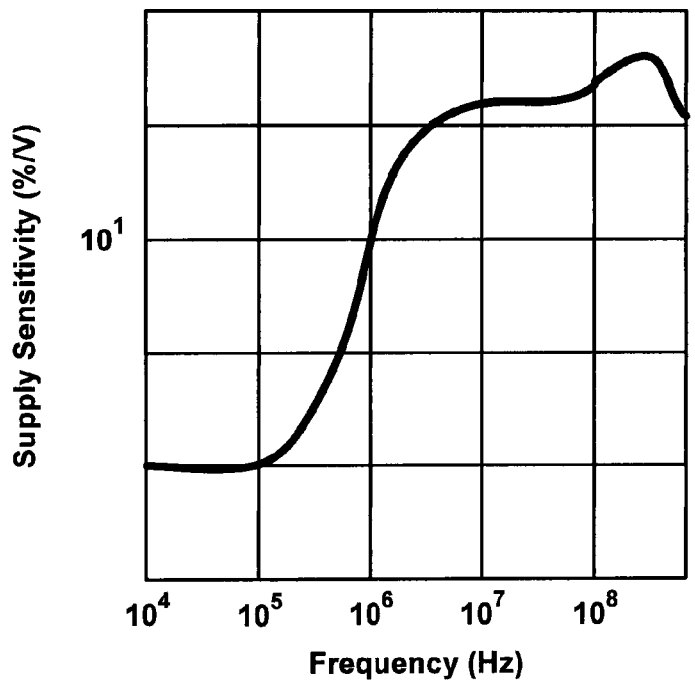

FIG. 16(a) shows the transfer function between the input and output clock duty-cycles. The transfer function exhibits a high-pass response. The DCC feedback loop is able to suppress the slow variation in the input duty-cycle, but not the fast variation. The transfer function flattens in the low-frequency region, indicating the feedback loop has a finite DC gain and is unable to correct the input duty-cycle variation entirely. FIG. 16(b) shows the supply sensitivity, also indicating that the DCC is effective in suppressing the low-frequency supply noise, but not as much in suppressing the high-frequency supply noise.

Figure 17:
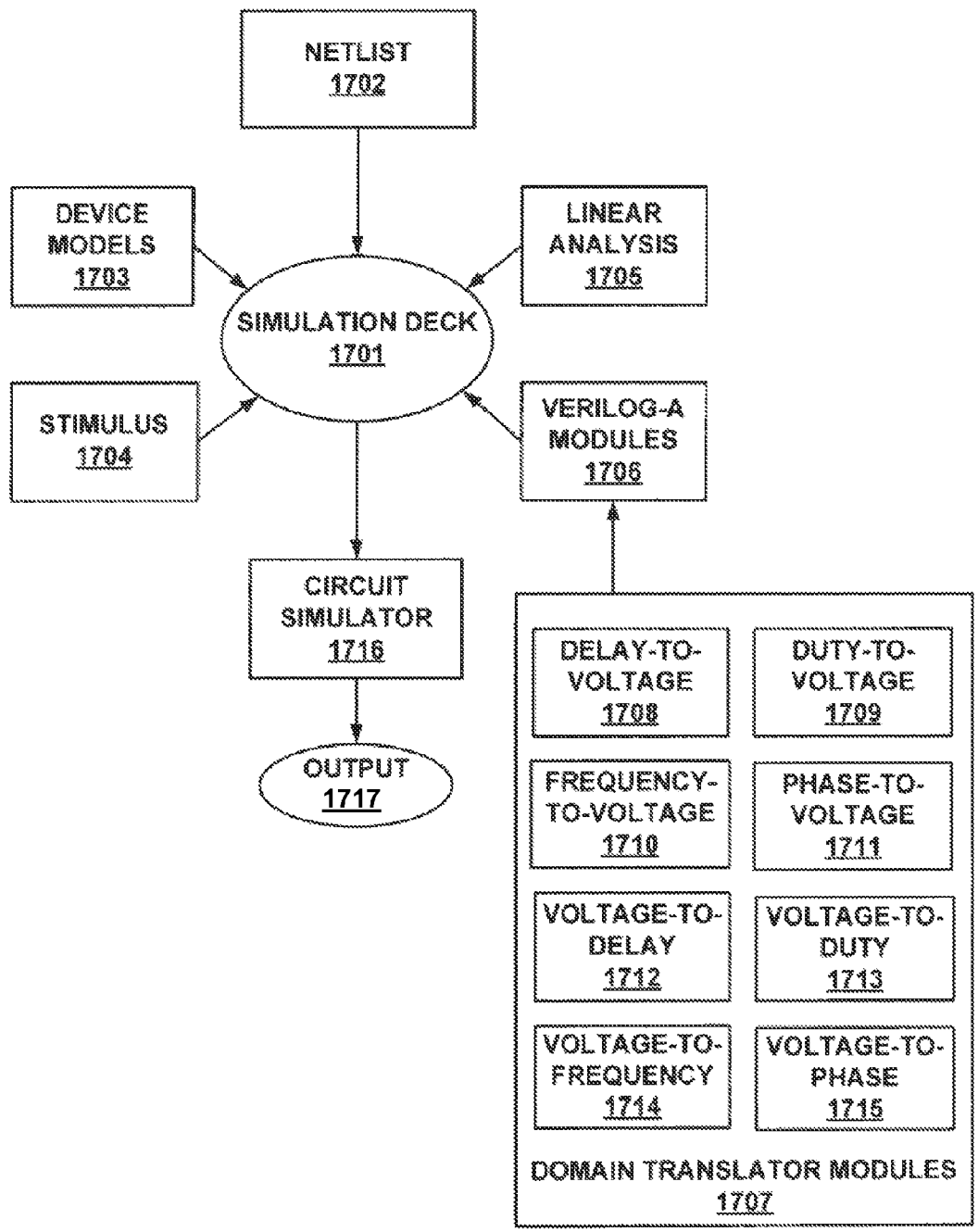
FIG. 17 shows a block diagram of the components of a system used to perform AC analysis on a circuit in a variable domain other than voltage or current.

FIG. 17 shows a block diagram of the components of a system used to perform linear analysis on a circuit in a domain other than voltage or current. A simulation deck 1701 is used to stage the circuit simulation. The simulation deck 1701 can be a text file in a format comprised of one or more statements. The simulation deck might reference or include other files. A netlist 1702, device models 1703, stimulus 1704, periodic AC analysis 1705, and Verilog-A modules 1706 are part of the simulation deck 1701. The netlist 1702 contains the netlist supplied by the user. The netlist defines the various components of the circuit under test and the connections between the components. Device models in 1703 stipulate the electrical characteristics of the specific components (e.g., resistors, capacitors, transistors, etc.) specified in the netlist. Stimuli contained in 1704 are used to stimulate the circuit (e.g. supply voltage for the circuit to operate off of, static or dynamic voltage waveforms provided to many inputs of the circuits). One of the stimuli is the small-signal sinusoidal input used during AC or PAC analysis with specified magnitude or phase (there can be more than one small-signal stimuli with different magnitude or phase, but with the same excitation frequency) The PAC analysis 1705 contains statements on the operations to be performed on the netlist. PAC analysis statements define the node voltage or branch current at which to measure the resulting steady-state response (magnitude and phase of the output sinusoid) and the range of excitation frequencies. (PAC analysis requires a PSS analysis to be done first; so simulation deck usually includes both PSS and PAC analysis statements). The Verilog-A modules (some simulators like Spectre-RF may have different types of behavioral description language such as Spectre-HDL or VHDL-AMS) in statement 1706 contain, amongst other modules for customizing the circuit simulator 1716, the various domain translator modules. Some exemplary domain translator modules are depicted in statement 1707. In one embodiment, there are eight domain translator modules 1708-1715. Module 1708 is a delay-to-voltage domain translator that converts a delay to a clock voltage waveform bearing the corresponding delay. Module 1709 is a duty-to-voltage domain translator. Module 1710 is a frequency-to-voltage domain translator. Module 1711 is a phase-to-voltage domain translator. Modules 1712-1715 are complements to modules 1708-1711. Specifically, module 1712 is a voltage-to-delay domain translator. Module 1713 is a voltage-to-duty domain translator. Module 1714 is a voltage-to-frequency domain translator. Module 1715 is a voltage-to-phase domain translator. There are also equivalent domain translator modules that convert these various domains (e.g., delay, duty, frequency, and phase) to current and also from current to these various domains.

Depending on the circuit being tested, the user specifies which of the domain translators are to be included as part of the overall circuit that is to be simulated. The domain translators are chosen to match the domain of interest. Even though the specified domain translators are not part of the actual circuit that is being tested, they are, for purposes of the simulator 1716, treated as being part of the circuit under test. The same domain translators can be used to test different circuits. In other words, the domain translators in Verilog-A modules statement 1707 can be kept constant and need not be modified in response to the circuit being tested. By applying the appropriate domain translators to translate between voltage or current to that of a different domain and vice versa, simulator 1716 can perform linear analysis on any circuit set forth in netlist 1702 in domains other that that of voltage or current. The resulting transfer function is output in block 1717.

In one embodiment, the domain translators 1707 are implemented in Verilog-A language, that is the most common programming language for describing analog circuit behavior. Alternatively, the equivalent functions can be implemented using other behavioral languages or combinations of ideal circuit elements such as resistors, capacitors, inductors, independent voltage or current sources, or dependent voltage or current sources. However, some guidelines should be followed in designing domain translators. First, domain translators are expected to yield correct perturbation results. The correct operation in transient simulation does not always guarantee the correct operation in linear analysis. For example, if the frequency of a clock was measured by its period (e.g., in a voltage-to-phase domain translator), it would work correctly in transient simulation, but it would yield an AC response of a phase, but not of a frequency (derivative of the phase). Furthermore, a perfect edge has a slope of either zero or infinity. Consequently, "if" statements should generally be avoided. Second, the Verilog-A domain translators should are not expected to have hidden states. This is because in some RF simulators (e.g., SpectreRF), hidden states are prohibited. The major limitation this implies is that some of the built-in primitives for ideal delay, z-domain filters, edge-triggered events, etc. cannot be used. Third, the translators are expected to simulate efficiently. As domain translators are expected to behave in an ideal fashion, it is possible to introduce very sharp transitions and hard switches in their Verilog-A models, which cause the variable-timestep circuit simulators to run very slow. For example, the delay-to-voltage domain translator (essentially a variable delay element) can be built with a chain of ideal sample-and-hold switches, only to find that the simulation is too slow. Thus, sharp edges and hard switching events should generally be avoided.

Figure 18:
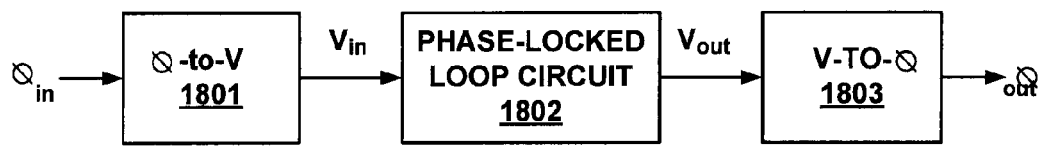
FIG. 18 shows a simulation process for performing AC analysis on a phase-locked loop circuit.

FIG. 18 shows a simulation process for performing linear analysis on a phase-locked loop circuit. For phase-locked loop circuits, the linearized response in the voltage or current domains are not of most designer's interest. As a result, any linear analysis of a phase-locked loop circuit performed strictly in terms of voltage or current domains would yield no useful information. However, phase-locked loops circuits are designed to behave in a linear fashion in the phase domain. This phase linearity is recognized and exploited by virtue of using two domain translators to convert the phase domain to the voltage domain and then to convert the voltage domain back to the phase domain. Specifically, a phase input ($\phi$in) to a phase-to-voltage domain translator 1801 produces a voltage representation of the periodic clock signal bearing such phase (Vin) that is input to the phase-locked loop circuit 1802. The output from the phase-locked loop circuit 1802 is a voltage representation of the output clock signal (Vout) and is input to a voltage-to-phase domain translator 1803. The output from the voltage-to-phase domain translator 1803 represents the waveform of the phase ($\phi$out) of the output clock. All the variables/signals representing either electrical or non-electrical are all expressed in electrical variables so the circuit simulators can perform AC analysis on both types of variables. By implementing the two domain translators 1801 and 1802, linear analysis can be performed on any phase-locked loop circuit being tested in block 1802. The phase-domain transfer function is obtained from the AC or PAC analysis that applies the small-signal sinusoid to the voltage representing the input phase ($\phi$in) and measures the response at the voltage representing the output phase ($\phi$out). This phase transfer function characterizes the operation of the phase-locked loop circuit in block 1802.

Figure 19:
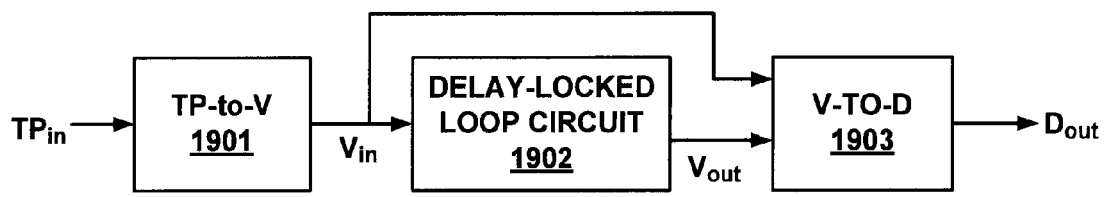
FIG. 19 shows a simulation process for performing AC analysis on a delay-locked loop circuit.

FIG. 19 shows a simulation process for performing linear analysis on a delay-locked loop circuit. For delay-locked loop circuits, the linearized responses in the voltage or current domains are not of most designer's interest. As a result, any linear analysis of a phase-locked loop circuit performed strictly in terms of voltage or current domains would yield no useful information. However, delay-locked loops circuits are designed to behave in a linear fashion in the delay (or period) domain. Consequently, two domain translators are used to convert the delay (or period) domain to the voltage domain and then to convert the voltage domain back to the delay domain. In particular, a delay (or period) is input (TPin) to a delay (or period)-to -voltage domain translator 1901. The TP-to-V domain translator 1901 outputs a voltage representation of the periodic clock signal bearing such delay (or period) (Vin) that is input to both the delay-locked loop circuit 1902 as well as the voltage-to-delay domain translator 1903. The delay-locked loop circuit 1902 produces a voltage (Vout) that is input to the voltage-to-delay domain translator 1903. The output from the voltage-to-delay domain translator 1903 represents the waveform of the delay (Dout) of the output clock. All the variables/signals representing either electrical or non-electrical are all expressed in electrical variables so the circuit simulators can perform AC analysis on both types of variables. By implementing the two domain translators 1901 and 1902, linear analysis can be performed on any delay-locked loop circuit being tested in block 1902. The linear analysis generates a transfer function that characterizes the operation of the delay-locked loop circuit in block 1902.

Figure 20:
FIG. 20 shows a simulation process for performing AC analysis on a duty-cycle corrector circuit.

FIG. 20 shows a simulation process for performing linear analysis on a duty-cycle corrector circuit. For duty-cycle corrector circuits, voltage and current domains are non-linear. As a result, any linear analysis performed on a duty-cycle corrector circuit strictly in terms of voltage or current domains would yield no useful information. However, duty-cycle corrector circuits behave in a linear fashion in the duty cycle domain. Consequently, two domain translators to convert the duty cycle domain to the voltage domain and then from the voltage domain back to the duty cycle domain. More particularly, a duty cycle input (DCin) is provided to duty cycle-to-voltage domain translator 2001. The DC-to-V domain translator 2001 outputs a voltage signal (Vin) that is input to the duty-cycle corrector circuit 2002. The duty-cycle corrector circuit 2002 produces a voltage (Vout) that is input to the voltage-to-duty cycle domain translator 2003. The output from the voltage-to-duty cycle domain translator 2003 is in given in terms of duty cycle (DCout). By implementing the two domain translators 2001 and 2002, linear analysis can be performed on any duty-cycle corrector circuit being tested in block 2002. The linear analysis generates a transfer function in terms of duty cycle out over duty cycle in. This duty cycle transfer function characterizes the operation of the duty-cycle corrector circuit in block 2002.

Figure 21:
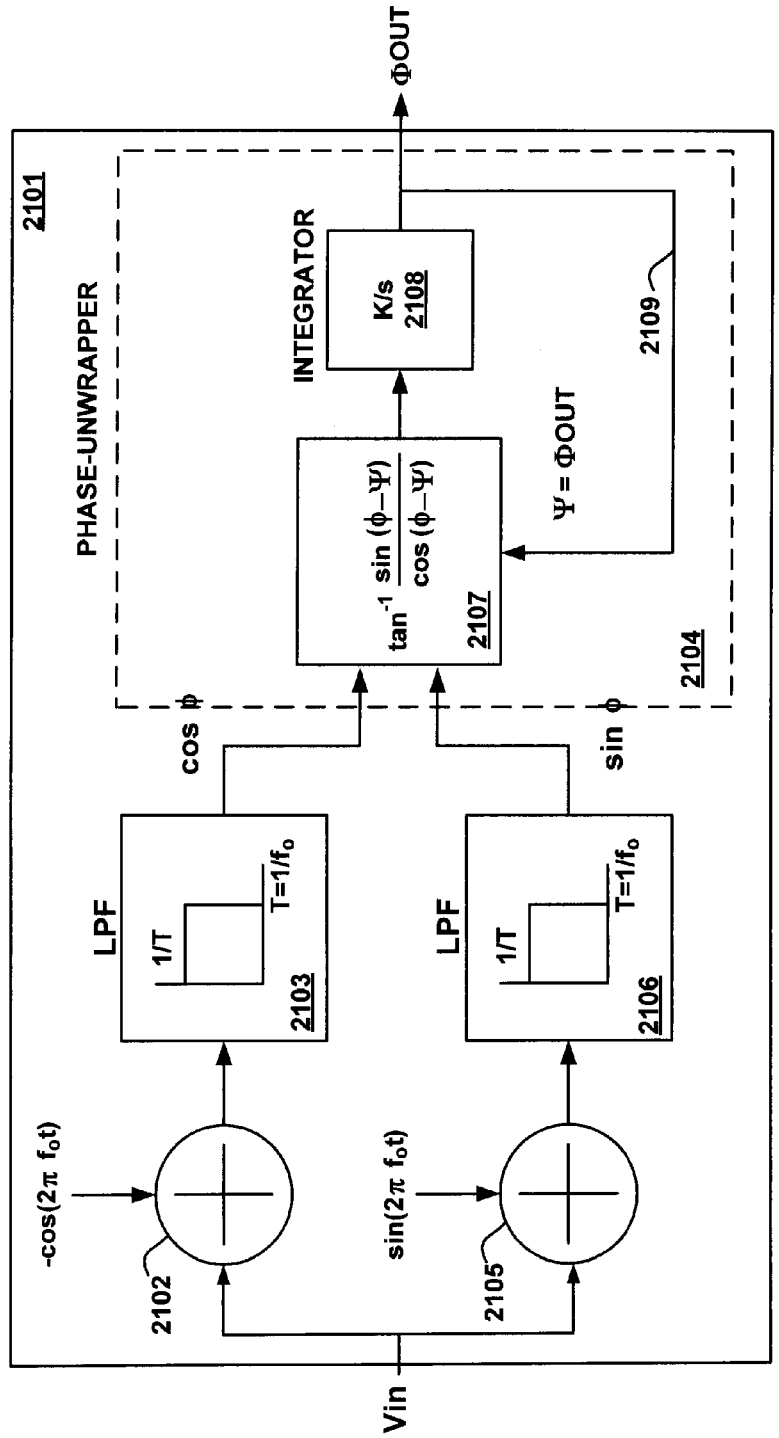
FIG. 21 is a diagram of an embodiment of a voltage-to-phase domain translator.

FIG. 21 is a diagram of an embodiment of a voltage-to-phase domain translator. Basically, the voltage-to-phase domain translator 2101 has a quadrature-mixing architecture (e.g., similar to those used in radio receivers). It converts a voltage input (Vin) into a phase output (Φout). This is accomplished by using a multiplier 2102 to multiply the Vin by −cos(2πf₀t) and then filtering the result through a low-pass filter 2103. The cos Φ output from the low-pass filter 2103 is input to a phase-unwrapper block 2104. A second multiplier 2105 multiplies Vin by sin(2πf₀t), which is then input to a second low-pass filter 2106. The sin Φ output from low pass filter 2106 is also input to the phase-unwrapper block 2104. Typically, to recover the phase, the tan⁻¹ function is used on sin Φ/cos Φ after the low-pass filters 2103 and 2106. However, this would lead to phase wrapping problems due to the fact that the output makes a discontinuous step whenever Φ crosses the ±π boundaries. In order to avoid this problem, the phase-unwrapper block 2104 provides a method to seamlessly unwrap the phase. Block 2104 is essentially a unity-gain feedback circuit having infinite DC gain. Integrator 2108 updates Φout with the change in Φ. The feedback path 2109 conveying Ψ=Φout is fed back to the tan⁻¹(sin(Φ−Ψ)/cos(Φ−Ψ)) block 2107. It is this feedback (Ψ=Φout) that keeps the argument in the tan⁻¹(sin(Φ−Ψ)/cos(Φ−Ψ) block 2107 always close to zero, thereby eliminating the problem of ±π boundary crossings. Thus, the voltage-to-phase domain translator 2101 is optimized for use in circuit simulators.

An example of Verilog-A source code for the voltage-to-phase domain translator of FIG. 21 is given below. Note that the phase-unwrapper starts with "//extract phase difference" and ends with the following "end." Also, the low-pass filter is given as a separate module. Ideally, the low-pass filter should be a sinc filter (or equivalently, a zero-th order hold filter). However, this cannot be modeled perfectly in finite order. Instead, the sinc filter is approximated with a finite-order continuous time filter, implemented in differential equations as shown below. The bandwidth of the filter is made adjustable by scaling the derivatives (ddt( )'s) with the clock period. Thus, this source code can be included as a module that can be used in conjunction with existing circuit simulators (e.g., SPICE, SpectreRF, ADS, HSPICE-RF, etc.) to perform linear analysis in domains other than the voltage domain or the current domain. The following source code is protected by copyright laws and is the property of Rambus, Inc.

```
// title : v2phase.va
// description:
//      periodic voltage waveform to phase translator
//      linearizable and with no hidden state
`include "discipline.h"
`include "constants.h"
`include "v2phase_filter.va"
module v2phase (vinp, vinn, phout);
    input vinp, vinn;       // clock waveform input
    output phout;           // phase output
    parameter real frequency = 1.0 from (0:inf);    // PSS frequency
    parameter real period = 1.0/frequency from (0:inf);   // PSS period
    electrical vinp, vinn, phout, gnd;
    electrical ref_i, ref_q, mix_i, mix_q, out_i, out_q;
    electrical ph_diff;
    electrical phbase, di, dq;
    ground gnd;
    branch (vinp, vinn) vin;
    // filters for PM-demodulation
    v2phase_filter #(.period(period))
        filter_I(mix_i, gnd, out_i, gnd),
        filter_Q(mix_q, gnd, out_q, gnd);
    analog begin
        // ideal reference sources
        V(phbase) <+ idtmod(1.0/period, 0.0, 1.0, −0.5);
        V(ref_i) <+ cos(2*`M_PI*V(phbase));
        V(ref_q) <+ sin(2*`M_PI*V(phbase));
        // PM-demodulation
        V(mix_i) <+ −V(vin) * V(ref_i);
        V(mix_q) <+ +V(vin) * V(ref_q);
        // extract phase difference
        V(di) <+ V(out_i)*cos(V(phout)) + V(out_q)*sin(V(phout));
        V(dq) <+ V(out_q)*cos(V(phout)) − V(out_i)*sin(V(phout));
        V(ph_diff) <+ atan(V(dq)/V(di));
        // phase output
        V(phout) <+ 2.0*`M_PI/period * idt(V(ph_diff), 0.0);
    end
endmodule
// title : v2phase_filter.va
// description:
//      low-pass filter used in PM demodulation
//      continuous-time approximation to sinc filter
`include "discipline.h"
`include "constants.h"
module v2phase_filter (inp, inn, outp, outn);
    input inp, inn;       // input voltage
    output outp, outn;    // output voltage
    parameter real period = 1 from (0:inf); // period
    electrical inp, inn, outp, outn;
    electrical x1, x2, x3, x4, x5, x6, x7, x8;
    branch (inp, inn) in;
    branch (outp, outn) out;
    analog begin
```

```
// state-space representation
V(x1): ddt(V(x1)) == (-53.42612361470103*V(x1) - 25.54395138271074*V(x2)
    -16.14354792221235*V(x3) - 7.20207729206980*V(x4)
    -4.54326760008683*V(x5) - 3.90983411111171*V(x6)
    -2.07803438192599*V(x7) - 1.03703336042262*V(x8)
    +2.0*V(in)) / period;
V(x2): ddt(V(x2)) == 64.0*V(x1) / period;
V(x3): ddt(V(x3)) == 32.0*V(x2) / period;
V(x4): ddt(V(x4)) == 32.0*V(x3) / period;
V(x5): ddt(V(x5)) == 16.0*V(x4) / period;
V(x6): ddt(V(x6)) == 8.0*V(x5) / period;
V(x7): ddt(V(x7)) == 8.0*V(x6) / period;
V(x8): ddt(V(x8)) == 4.0*V(x7) / period;
V(out) <+ 0.03145791591842*V(x1) + 0.81664402479002*V(x2)
    + 0.01348407930514*V(x3) + 0.49809691696488*V(x4)
    + 0.00421680043793*V(x5) + 0.56420892498463*V(x6)
    + 0.00198849534266*V(x7) + 0.51851509821769*V(x8);
    end
endmodule
```

Figure 22:
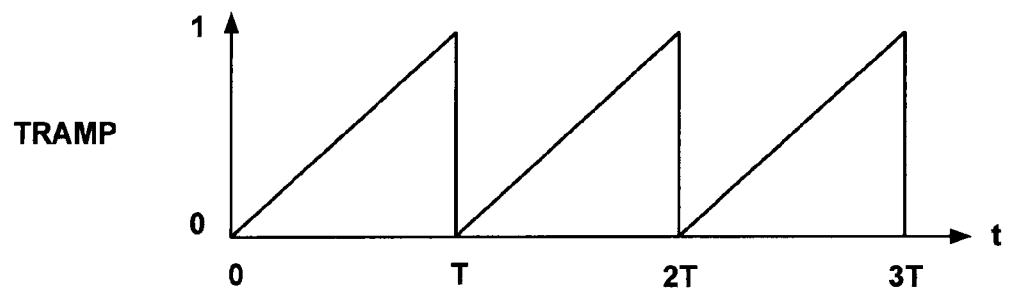
FIG. 22 is a diagram of an embodiment of a voltage-to-delay domain translator.
Figure 22:
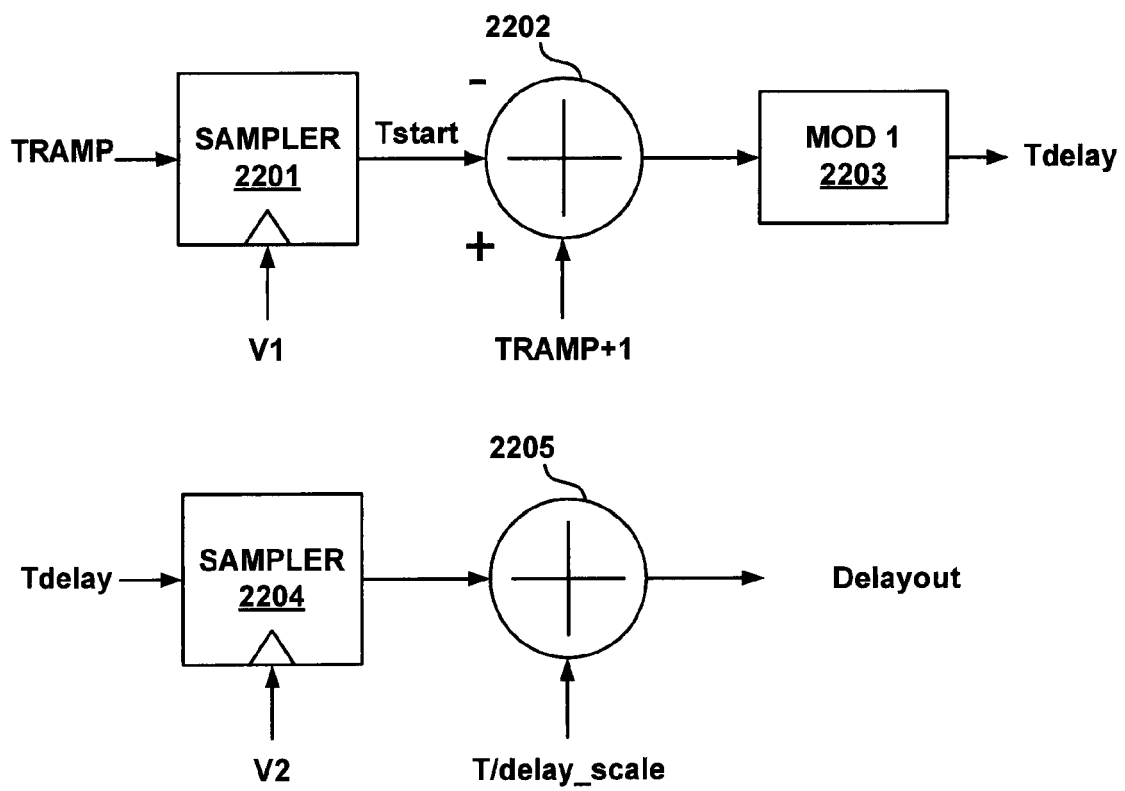

FIG. 22 is a diagram of an embodiment of a voltage-to-delay domain translator. The voltage-to-delay domain translator measures the delay between the V1 crossing event and the V2 crossing event and generates an output in the form of a voltage (Delayout). Basically, a ramp voltage is sampled that is equivalent to the twice the absolute simulation time. It is sampled once when V1 rises and once when V2 rises. The delay is the difference between these two sampled values. In one embodiment, some modifications have been made to operate the voltage-to-delay domain translator in periodic fashion for use in periodic analysis, such as PSS and PAC. First, the ramp voltage is replaced with a ramp with periodic reset. Second, the difference operator is modified as a difference followed by a modulo operator. Referring to FIG. 22, a ramp voltage (Tramp) is input to sampler 2201. Sampler 2201 samples the ramp voltage every time V1 crosses zero. The sampled voltage (Tstart) from sampler 2201 is subtracted from the ramp voltage (Tramp)+1 by means of adder 2202. A modulo 1 operator 2203 is used to generate the delay voltage (Tdelay). The delay voltage is input to a second sampler 2204. Sampler 2204 samples Tdelay every time V2 crosses zero. Multiplier 2205 multiplies the output from sampler by a the period over a delay scale (T/delay_scale). The delay (Delayout) is given as the output from multiplier 2205.

It should be noted that to implement the circuit of FIG. 22 in Verilog-A code, the samplers 2201 and 2204 are implemented with variable resistors (e.g., switches) and ideal capacitors rather than crossing event triggers (e.g., @cross available in Verilog-A). This is because the @cross event triggers may not yield the correct perturbation results. Due to the finite numerical precision the simulator can offer, if the variable resistors switch too fast, they can desensitize the linearized response of interest and thus give wrong linear analysis results. Moreover, because the rate of transition is not known a priori, the Verilog-A model must have an internal adaptation loop that monitors the transition rate and adjusts the switch turn-on rate accordingly.

Figure 23:
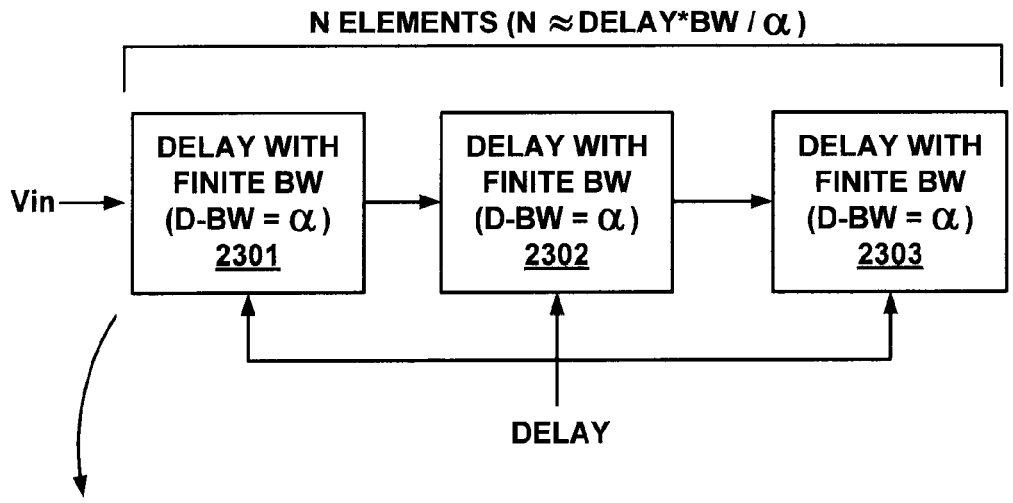
FIG. 23 is a diagram of an embodiment of a delay-to-voltage domain translator.

FIG. 23 is a diagram of an embodiment of a delay-to-voltage domain translator (e.g., a variable delay element). It should be noted that the delay-to-voltage domain translator cannot use the Verilog-A built-in primitive "absdelay( )" because it has hidden states that are prohibited by Spectre-RF simulators. The ideal delay element with infinite Vin-to-Vout bandwidth requires an infinite order system, that is infeasible in practical systems. Thus, the delay elements 2301-2303 are assumed to have finite Vin-to-Vout bandwidth. The main property of a delay element (i.e., system order) is determined by the product of the delay and the bandwidth. The absolute delay can be set by the scaling factor in the differential equation, as noted in FIG. 23. The delay element can be implemented as a single system with an order corresponding to the delay-bandwidth product, or as a collection of prebuilt delay elements 2301-2303 with a fixed (smaller) delay-bandwidth product, α. In an alternative embodiment, each delay block is implemented with a chain of ideal sample-and-hold filters and the sampling clock period is set to vary with the delay. However, the simulation becomes very slow due to the very sharp edges and hard switching events.

Figure 24:
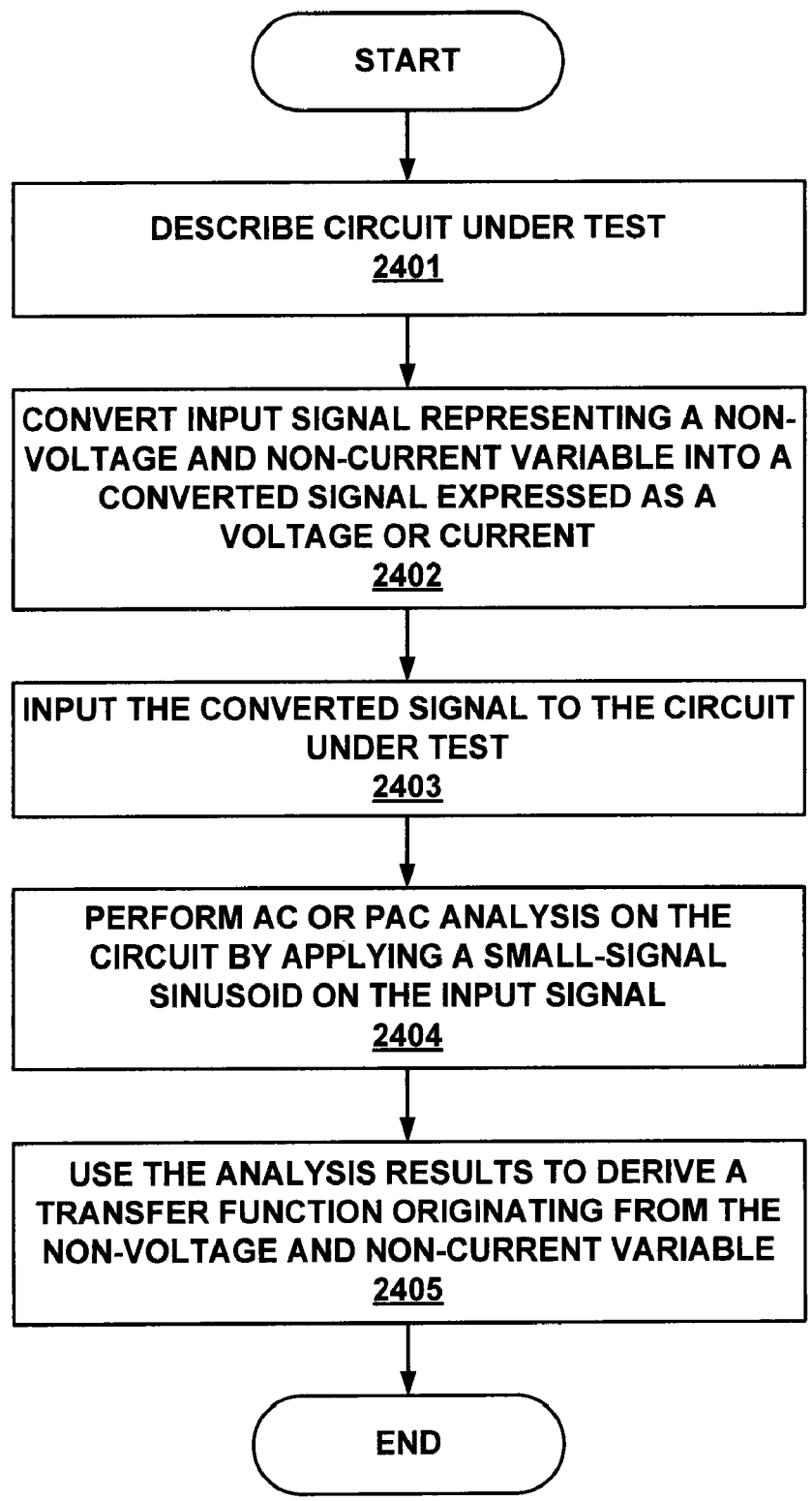
FIG. 24 is a flowchart describing a process for performing the AC analysis for circuits whose linearized response of interest is in variables other than voltage or current.

FIG. 24 is a flowchart describing a process for performing the linear analysis for circuits whose linearized response of interest is in variables other than voltage or current. Initially, in step 2401, a user inputs a netlist that describes a circuit that the user wants to test by having a linear analysis performed on the circuit. In step 2402, an input signal that represents a non-voltage and non-current variable is converted into a signal expressed as a voltage or current. The converted signal is input to the circuit under test, step 2403. Thereupon, a small-signal sinusoid is applied on the input signal in step 2404 in order to perform AC or PAC analysis on the circuit. Finally, in step 2405, the AC or PAC analysis results are used to derive a transfer function originating from the non-voltage and non-current variable.

In conclusion, a method of transforming variable domains in that linear circuit analysis can be performed in circuit simulators is disclosed. In the foregoing specification, embodiments of the claimed subject matter have been described with reference to numerous specific details that can vary from implementation to implementation. Thus, the sole and exclusive indicator of what is, and is intended by the applicants to be the claimed subject matter is the set of claims that issue from this application, in the specific form in that such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:
1. A method for analyzing a response of a circuit, the method comprising:
receiving a circuit model for the circuit, wherein the circuit model has a non-linear behavior with respect to voltage or current variables, and a linear behavior with respect to a variable-of-interest, wherein the variable-of-interest is not a voltage or a current;

coupling an input domain translator to an input of the circuit model, wherein the input domain translator translates an input expressed in terms of the variable-of-interest into a corresponding voltage or current input for the circuit model;

coupling an output domain translator to an output of the circuit model, wherein the output domain translator translates a voltage or current output from the circuit model into a corresponding output expressed in terms of the variable-of-interest; and determining the response of the circuit with respect to the variable-of-interest by using a computer running a circuit simulator to analyze a collective behavior of the input domain translator, the circuit model, and the output domain translator, wherein the circuit simulator operates on voltages or currents and treats the variable-of-interest as a pseudo-voltage.

2. The method of claim 1, further comprising:
using the response to determine a modification for the circuit; and
applying the determined modification to a design for the circuit.

3. The method of claim 1, wherein determining the response of the circuit comprises performing a time-varying AC analysis on the circuit, which involves applying a time-varying AC excitation signal expressed in terms of the variable-of-interest to the input of the input domain translator.

4. The method of claim 3, wherein the response of the circuit is determined across a range of frequencies to produce a transfer function.

5. The method of claim 1, wherein the variable-of-interest is one of:
a phase;
a frequency;
a delay; and
a duty cycle.

6. The method of claim 1, wherein the circuit is one of:
a phase-locked loop;
a delay-locked loop;
an oscillator; and
a duty-cycle corrector.

7. The method of claim 1, wherein the voltage or current input of the circuit model comprises one of:
a voltage signal;
a current signal; and
a current and voltage signal.

8. The method of claim 1, wherein the input domain translator translates a phase to a voltage, and wherein the input domain translator operates by:
receiving the phase;
calculating a cosine of the phase added to a frequency multiplied by a time variable $f_0 t$;
computing an arctangent of the cosine; and
multiplying the arctangent by an amplitude and adding an offset to produce the voltage.

9. The method of claim 1, wherein the output domain translator translates a voltage to a phase, and wherein the output domain translator operates by:
receiving the voltage;
mixing the voltage with an input phase of the reference clock voltage, $-\cos(2\pi f_0 t)$, and low-pass filtering a result of mixing the voltage with an input phase of the reference clock voltage to produce a cosine of the phase;
mixing the voltage with a quadrature phase of the reference clock voltage, $\sin(2\pi f_0 t)$, and low-pass filtering a result of mixing the voltage with a quadrature phase of the reference clock voltage to produce a sine of the phase;
computing a ratio between the sine of the phase and the cosine of the phase;
computing an arctangent of the ratio to produce the phase; and
feeding the phase through an integrator feedback loop to eliminate discontinuities that arise when the phase crosses ±π boundaries.

10. The method of claim 1, wherein the input domain translator translates a delay to a voltage, and wherein the input domain translator operates by:
receiving the delay; and
using a finite-order continuous time-filter to add the delay to an input voltage to produce the voltage.

11. The method of claim 1, wherein the output domain translator translates a voltage to a delay, and wherein the output domain translator operates by:
receiving the voltage, wherein the voltage includes a first voltage signal, which is not delayed and a second voltage signal, which includes the delay;
applying the first voltage signal to a first sampler which records a first time at which a first event occurs in the first voltage signal;
applying the second voltage signal to a second sampler which records a second time at which a second event occurs in the second voltage signal; and
computing the delay as a difference between the first time and the second time.

12. The method of claim 1, wherein the input domain translator translates a frequency to a voltage, and wherein the input domain translator operates by:
receiving a frequency;
integrating a difference between the frequency and a reference frequency to produce a phase;
calculating a cosine of the phase added to a frequency multiplied by a time variable, $f_0 t$;
computing an arctangent of the cosine; and
multiplying the arctangent by an amplitude and adding an offset to generate the voltage.

13. The method of claim 1, wherein the output domain translator translates a voltage to a frequency, and wherein the output domain translator operates by:
receiving the voltage;
mixing the voltage with an input phase of the reference clock voltage, $-\cos(2\pi f_0 t)$, and low-pass filtering a result of mixing the voltage with an input phase of the reference clock voltage to produce a cosine of the phase;
mixing the voltage with a quadrature phase of the reference clock voltage, $\sin(2\pi f_0 t)$, and low-pass filtering a result of mixing the voltage with a quadrature phase of the reference clock voltage to produce a sine of the phase;
computing a ratio between the sine of the phase and the cosine of the phase;
computing an arctangent of the ratio to produce the phase;
feeding the phase through an integrator feedback loop to eliminate discontinuities that arise when the phase crosses ±π boundaries; and
differentiating the phase with respect to time to produce the frequency.

14. The method of claim 1, wherein the circuit model, the input domain translator and the output domain translator are specified using a Verilog™ programming language.

15. A system that analyzes a response for a circuit, comprising:
- a circuit model for the circuit, wherein the circuit model has a non-linear behavior with respect to voltage or current variables, and a linear behavior with respect to a variable-of-interest, wherein the variable-of-interest is not a voltage or a current;
- a domain transformer configured to perform operations comprising,
  - coupling an input domain translator to an input of the circuit model, wherein the input domain translator translates an input expressed in terms of the variable-of-interest into a corresponding voltage or current input for the circuit model, and
  - coupling an output domain translator to an output of the circuit model, wherein the output domain translator translates a voltage or current output from the circuit model into a corresponding output expressed in terms of the variable-of-interest; and
- a circuit simulator configured to determine the response of the circuit with respect to the variable-of-interest by analyzing a collective behavior of the input domain translator, the circuit model, and the output domain translator, wherein the circuit simulator operates on voltages or currents and treats the variable-of-interest as a pseudo-voltage.

16. The system of claim 15, further comprising a modification module configured to perform operations comprising:
- using the response to determine a modification for the circuit; and
- applying the determined modification to a design for the circuit.

17. The system of claim 15, wherein while determining the response of the circuit, the circuit analyzer is configured to perform a time-varying AC analysis on the circuit, which involves applying a time-varying AC excitation signal expressed in terms of the variable-of-interest to the input of the input domain translator.

18. The system of claim 17, wherein the circuit analyzer is configured to determine the response of the circuit across a range of frequencies to produce a transfer function.

19. The system of claim 15, wherein the variable-of-interest is one of:
- a phase;
- a frequency;
- a delay; and
- a duty cycle.

20. The system of claim 15, wherein the circuit is one of:
- a phase-locked loop;
- a delay-locked loop;
- an oscillator; and
- a duty-cycle corrector.

21. The system of claim 15, wherein the voltage or current input of the circuit model comprises one of:
- a voltage signal;
- a current signal; and
- a current and voltage signal.

22. The system of claim 15, wherein the circuit model, the input domain translator and the output domain translator are specified using a Verilog™ programming language.

23. A non-transitory computer-readable storage medium storing instructions that when executed by a computer cause the computer to perform a method for analyzing a response of a circuit, the method comprising:
- receiving a circuit model for the circuit, wherein the circuit model has a non-linear behavior with respect to voltage or current variables, and a linear behavior with respect to a variable-of-interest, wherein the variable-of-interest is not a voltage or a current;
- coupling an input domain translator to an input of the circuit model, wherein the input domain translator translates an input expressed in terms of the variable-of-interest into a corresponding voltage or current input for the circuit model;
- coupling an output domain translator to an output of the circuit model, wherein the output domain translator translates a voltage or current output from the circuit model into a corresponding output expressed in terms of the variable-of-interest; and
- simulating the response of the circuit with respect to the variable-of-interest to analyze a collective behavior of the input domain translator, the circuit model, and the output domain translator, wherein simulating the response comprises simulating voltages or currents and treating the variable-of-interest as a pseudo-voltage.

24. The computer-readable storage medium of claim 23, wherein the method further comprises:
- using the response to determine a modification for the circuit; and
- applying the determined modification to a design for the circuit.

25. The computer-readable storage medium of claim 23, wherein determining the response of the circuit comprises performing a time-varying AC analysis on the circuit, which comprises applying a time-varying AC excitation signal expressed in terms of the variable-of-interest to the input of the input domain translator.

26. The computer-readable storage medium of claim 25, wherein the response of the circuit is determined across a range of frequencies to produce a transfer function.

27. The computer-readable storage medium of claim 23, wherein the variable-of-interest is one of:
- a phase;
- a frequency;
- a delay; and
- a duty cycle.

28. The computer-readable storage medium of claim 23, wherein the circuit is one of:
- a phase-locked loop;
- a delay-locked loop;
- an oscillator; and
- a duty-cycle corrector.

29. A computer system that analyzes a response for a circuit, comprising:
- a memory that stores data comprising,
  - a circuit model for the circuit, wherein the circuit model has a non-linear behavior with respect to voltage or current variables, and a linear behavior with respect to a variable-of-interest, wherein the variable-of-interest is not a voltage or a current,
  - an input domain translator configured to translate an input expressed in terms of the variable-of-interest into a corresponding voltage or current input for the circuit model,
  - an output domain translator configured to translate an output of the circuit model, wherein the output domain translator translates a voltage or current output from the circuit model into a corresponding output expressed in terms of the variable-of-interest, and
  - a circuit simulator program; and a processor coupled to the memory that executes the circuit simulator program to determine the response of the circuit with respect to the variable-of-interest by analyzing a collective behavior of the input domain translator, the circuit model, and the output domain translator, wherein the circuit simulator program operates on voltages or currents and treats the variable-of-interest as a pseudo-voltage.

* * * * *